(12) United States Patent  (10) Patent No.: US 7,829,450 B2
Hammer et al.  (45) Date of Patent: Nov. 9, 2010

(54) METHOD OF PROCESSING A CONTACT PAD, METHOD OF MANUFACTURING A CONTACT PAD, AND INTEGRATED CIRCUIT ELEMENT

(75) Inventors: Markus Hammer, Pielenhofen (DE); Guenther Ruhl, Regensburg (DE); Andreas Strasser, Regensburg (DE); Michael Melzl, Neutraubling (DE); Reinhard Goellner, Regensburg (DE); Doerthe Groteloh, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 58 days.

(21) Appl. No.: 11/936,541

(22) Filed: Nov. 7, 2007

(65) Prior Publication Data

US 2009/0115074 A1    May 7, 2009

(51) Int. Cl.
  *H01L 21/44* (2006.01)
(52) U.S. Cl. .................. 438/612; 438/954; 438/958
(58) Field of Classification Search ................ 438/612, 438/724, 744, 757, 762, 763, 791, 954, 958; 257/E23.02
  See application file for complete search history.

(56) References Cited

U.S. PATENT DOCUMENTS

| 6,069,066 | A | 5/2000 | Huang et al. | |
| 6,620,720 | B1* | 9/2003 | Moyer et al. | 438/612 |
| 6,667,230 | B2* | 12/2003 | Chen et al. | 438/613 |
| 6,683,383 | B2 | 1/2004 | Gleixner et al. | |
| 6,713,381 | B2 | 3/2004 | Barr et al. | |
| 6,715,663 | B2 | 4/2004 | Seshan et al. | |
| 6,833,604 | B2 | 12/2004 | Tsau | |
| 6,881,996 | B2 | 4/2005 | Chen et al. | |
| 7,056,820 | B2* | 6/2006 | Cole et al. | 438/618 |
| 2002/0038903 | A1 | 4/2002 | Tsau | |
| 2006/0003576 | A1 | 1/2006 | Yeh et al. | |
| 2006/0016861 | A1 | 1/2006 | Daubenspeck et al. | |
| 2007/0111502 | A1 | 5/2007 | Daubenspeck et al. | |

FOREIGN PATENT DOCUMENTS

WO    WO 03/085735 A1    10/2003

\* cited by examiner

*Primary Examiner*—Hung Vu
(74) *Attorney, Agent, or Firm*—Slater & Matsil, L.L.P.

(57) ABSTRACT

In a method of processing a contact pad, a passivation layer stack including at least one passivation layer is formed on at least an upper surface of a contact pad region. A first portion of the passivation layer stack is removed from above the contact pad region, wherein a second portion of the passivation layer remains on the contact pad region and covers the contact pad region. An adhesion layer is formed on the passivation layer stack. The adhesion layer is patterned, wherein the adhesion layer is removed from above the contact pad region. Furthermore, the second portion of the passivation layer stack is removed.

16 Claims, 17 Drawing Sheets

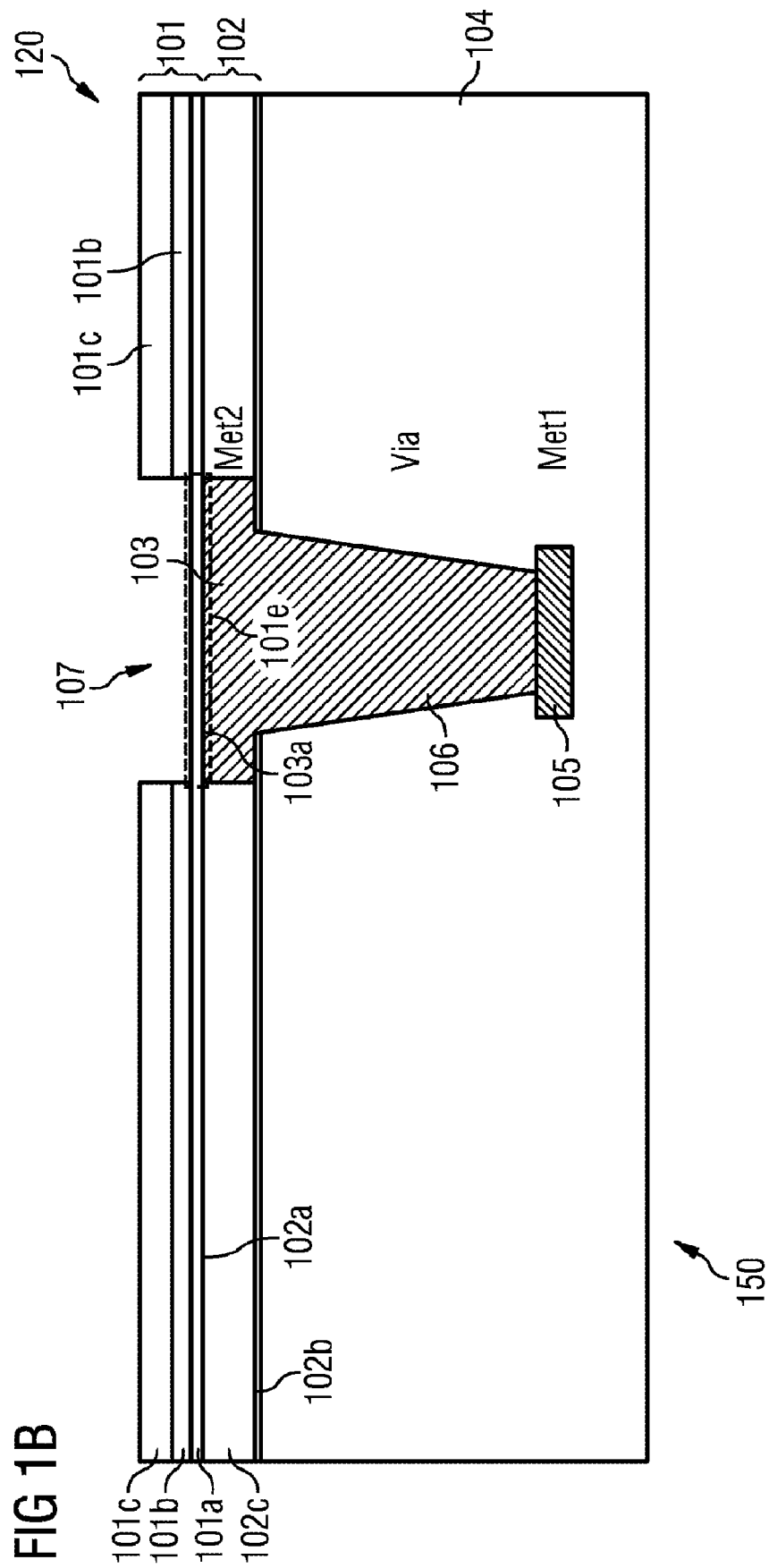

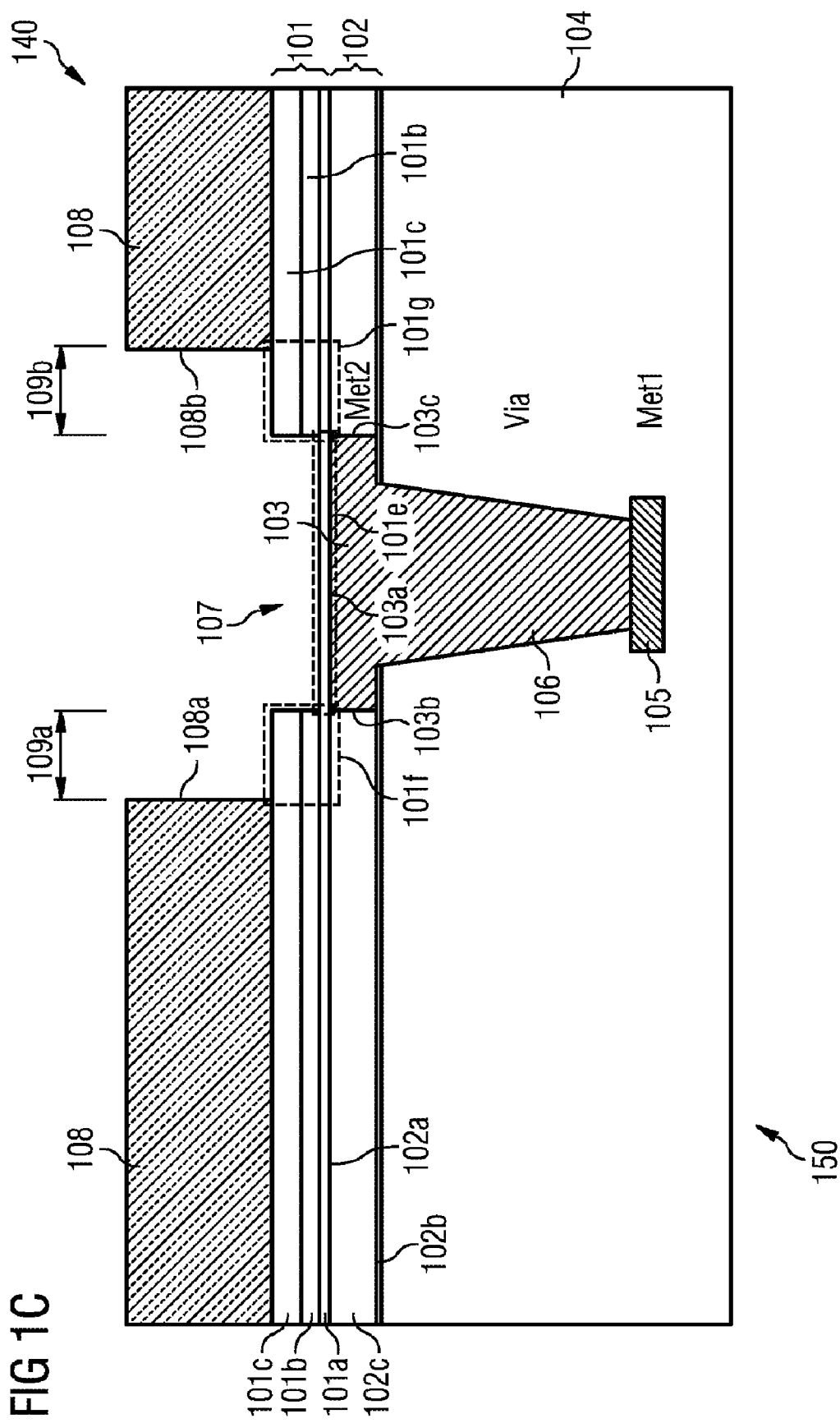

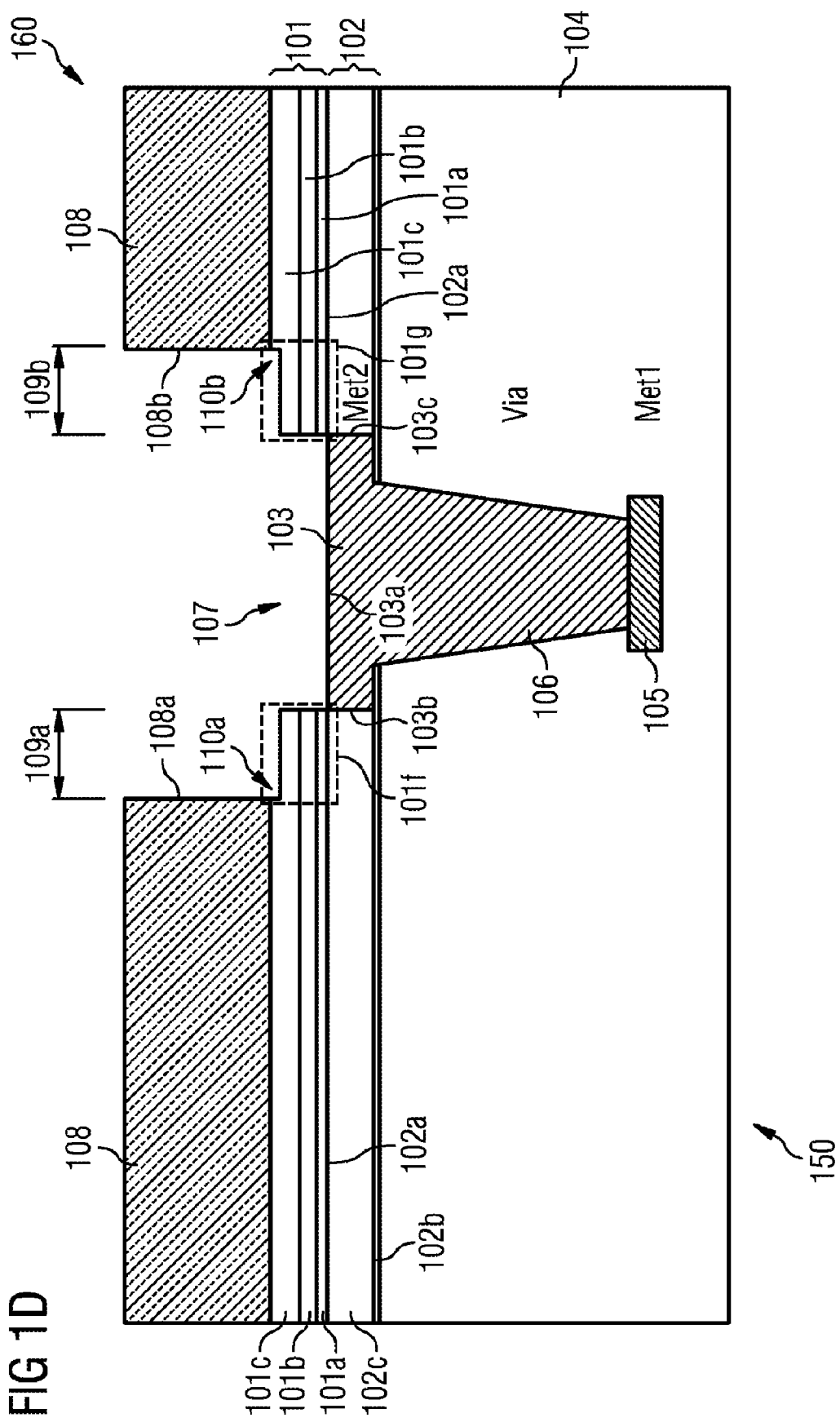

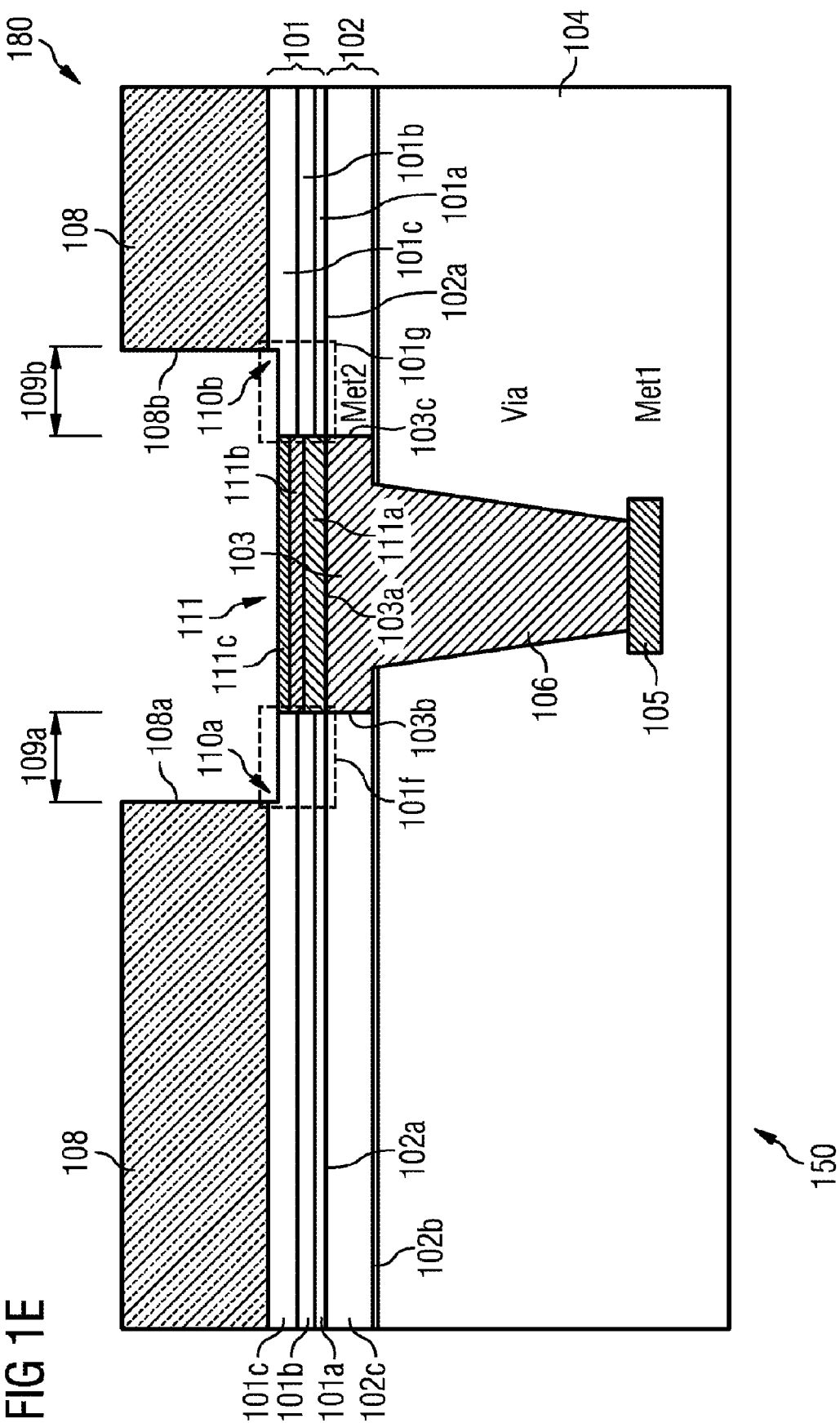

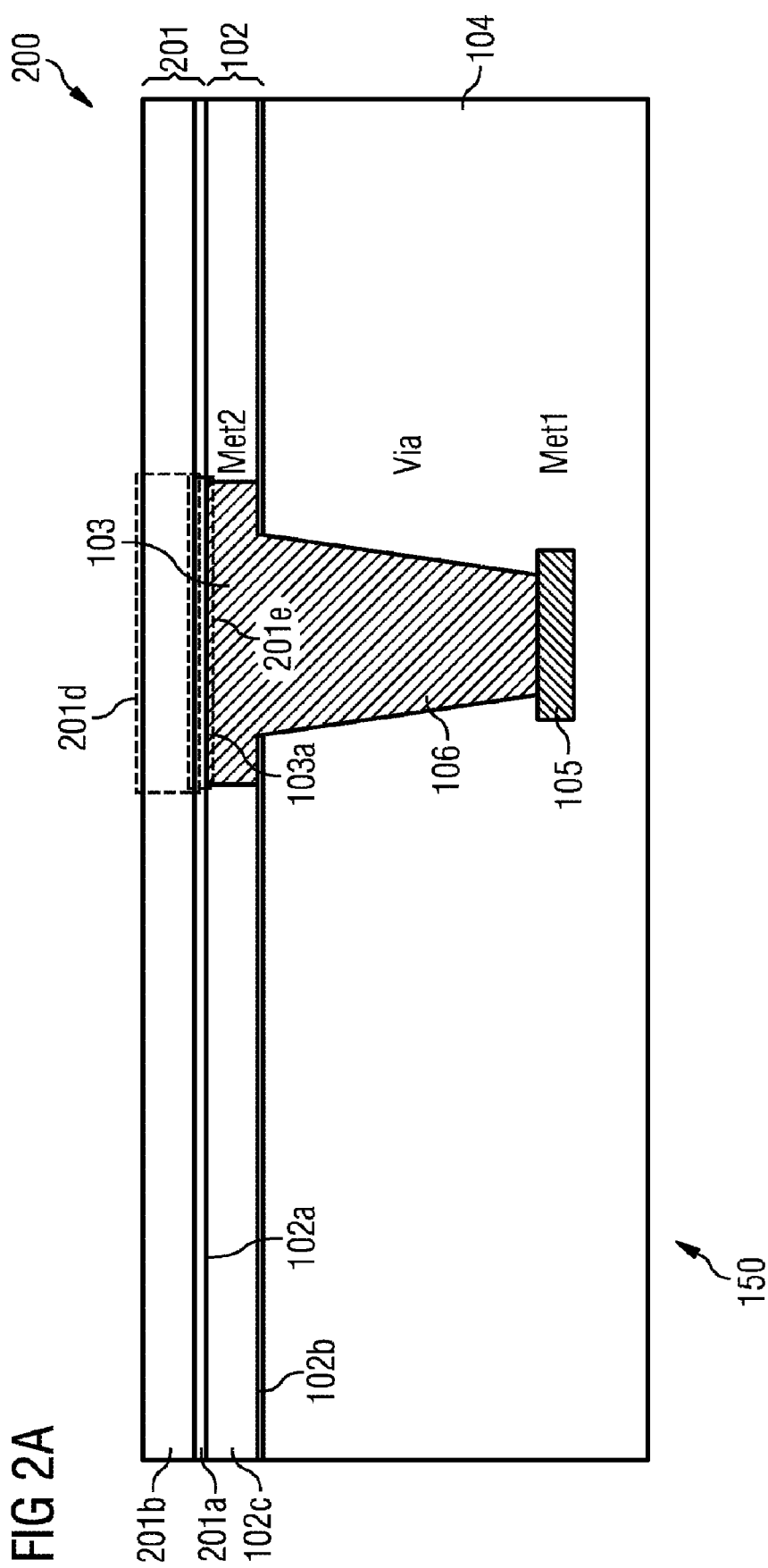

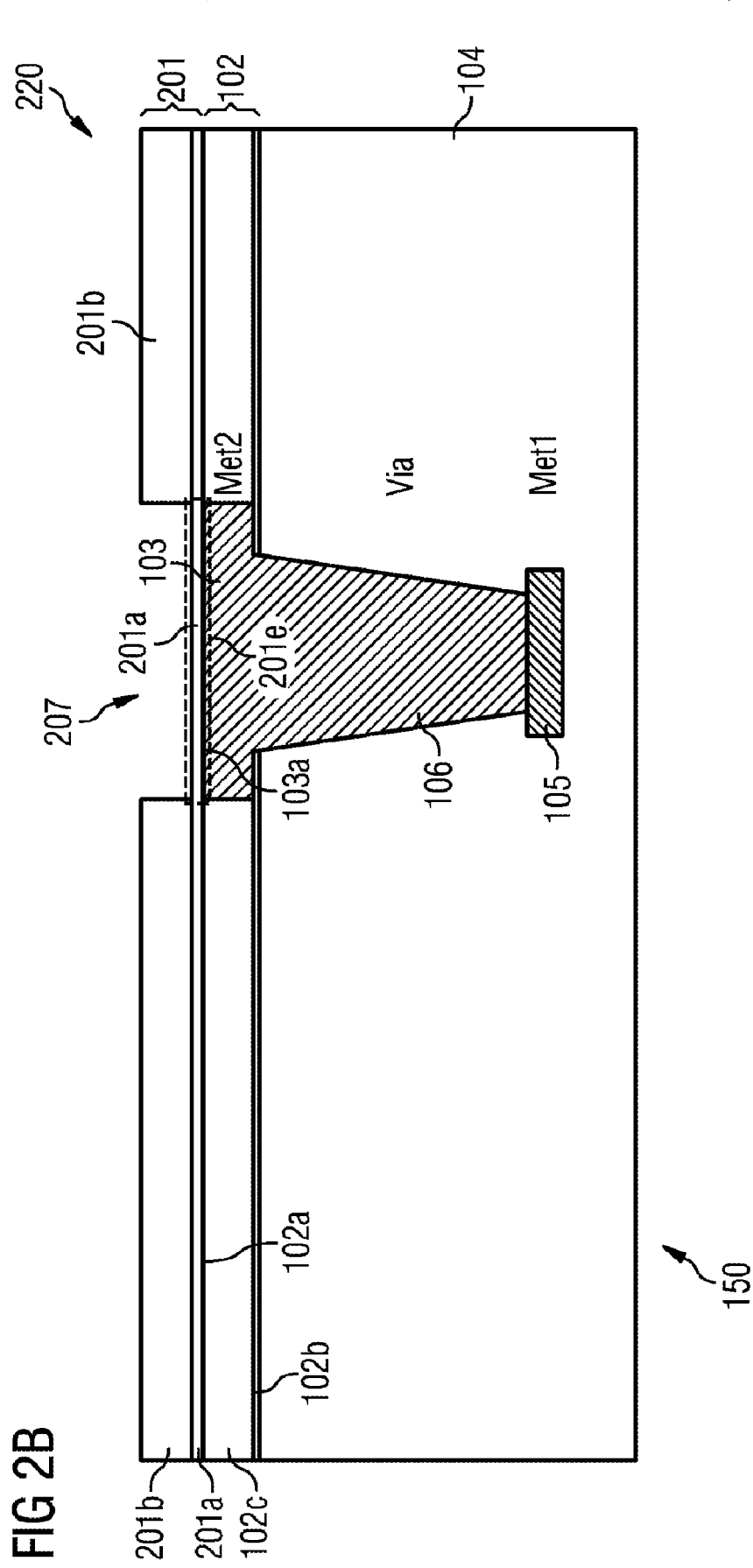

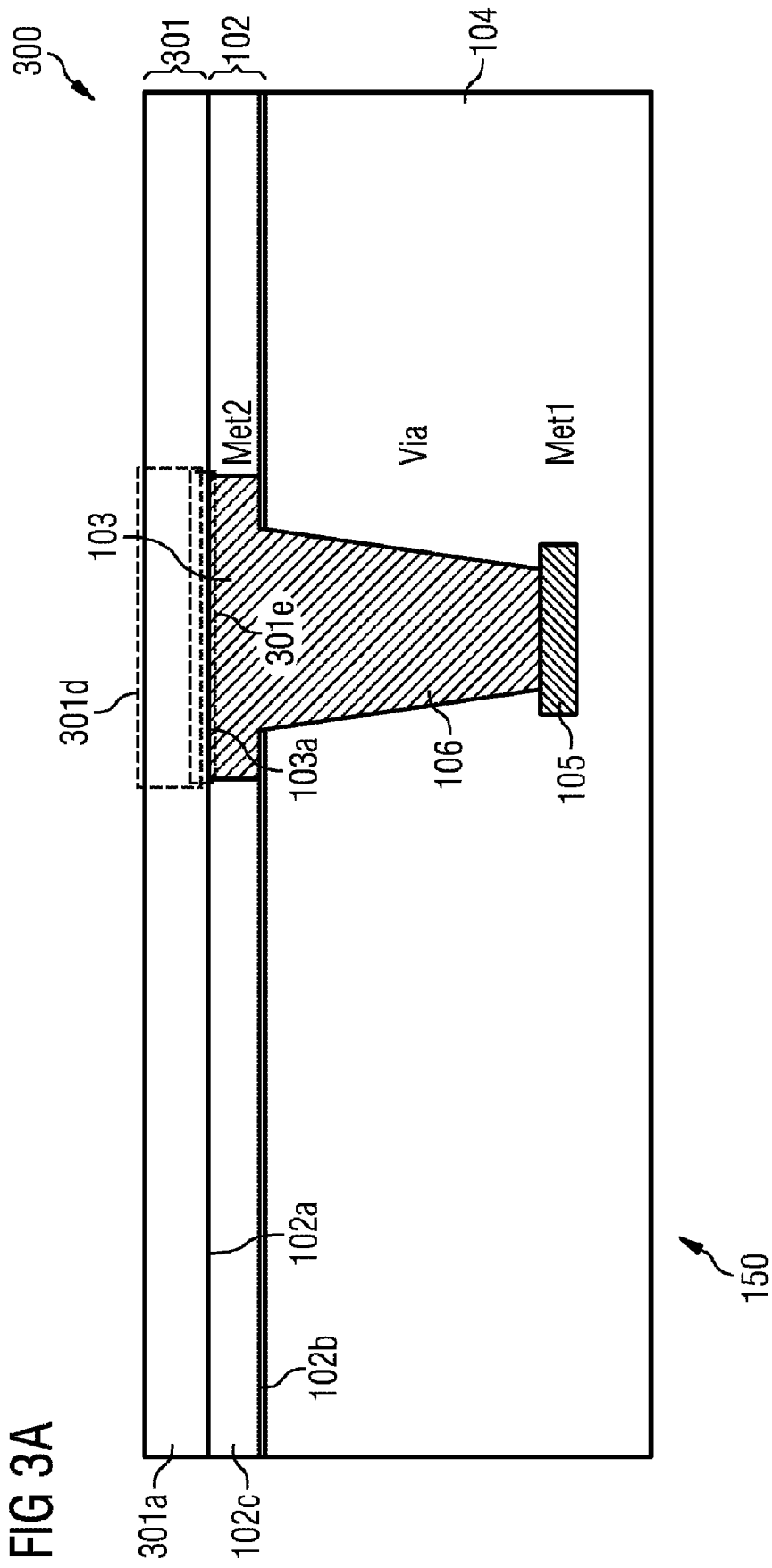

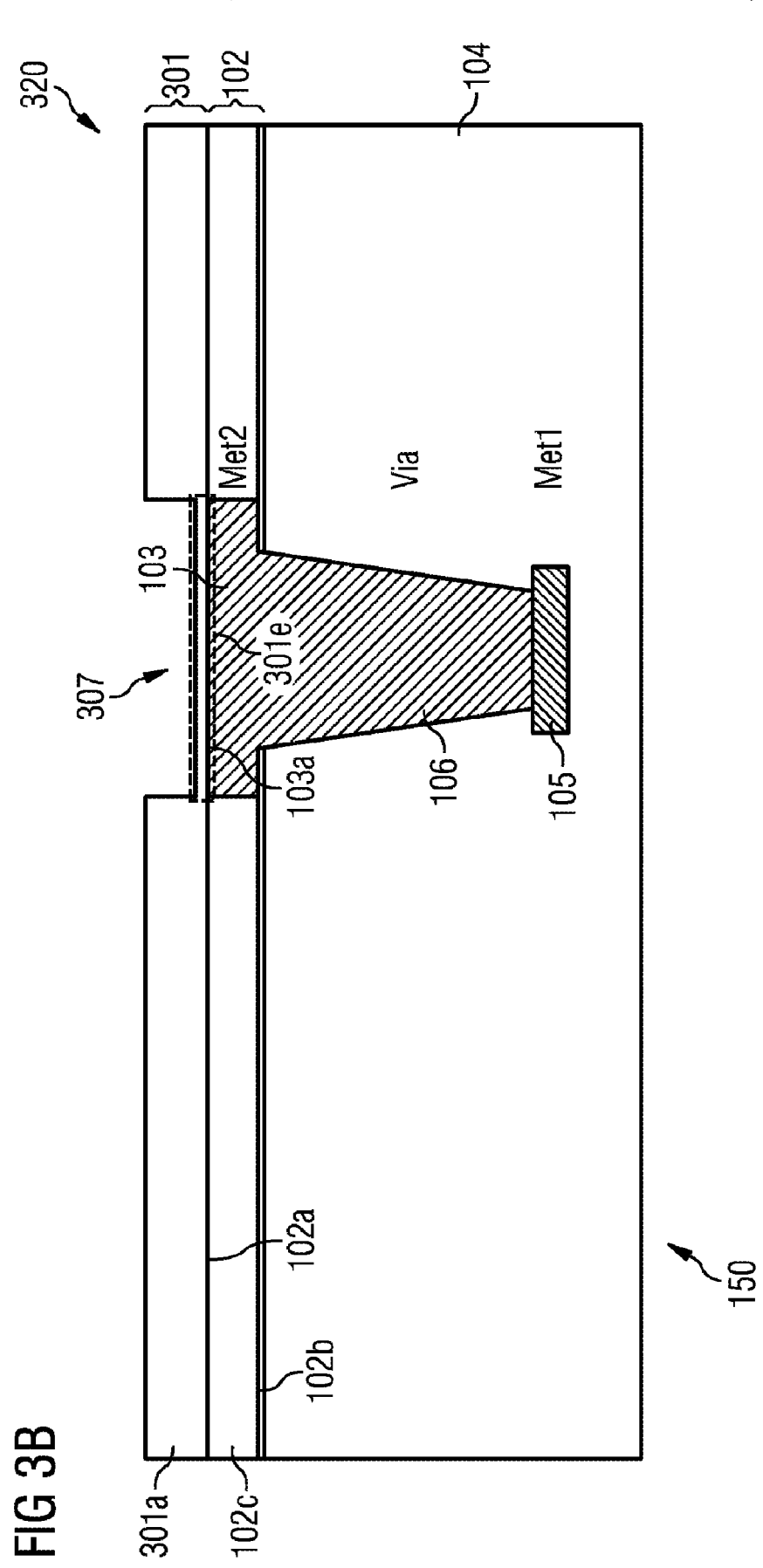

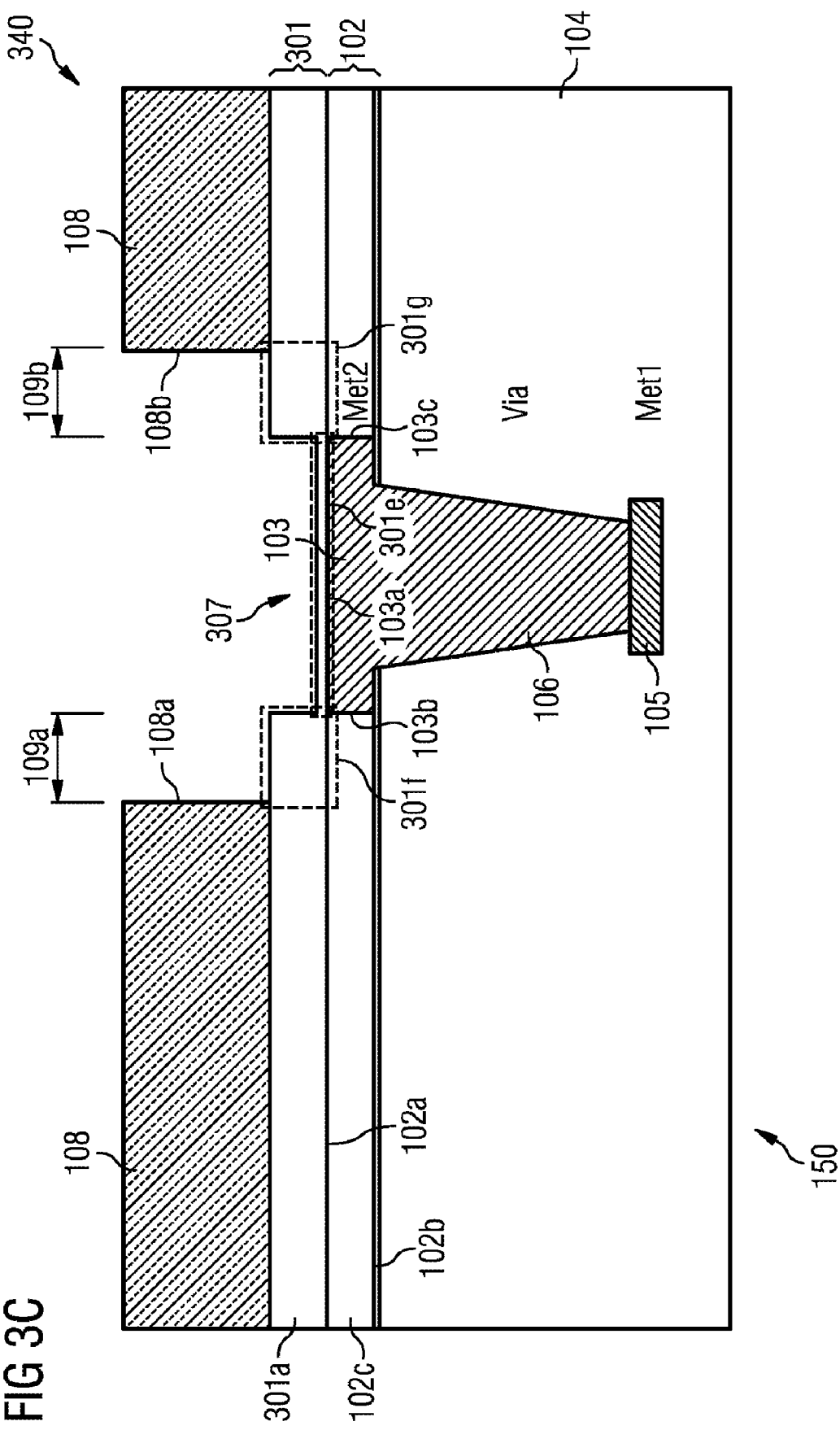

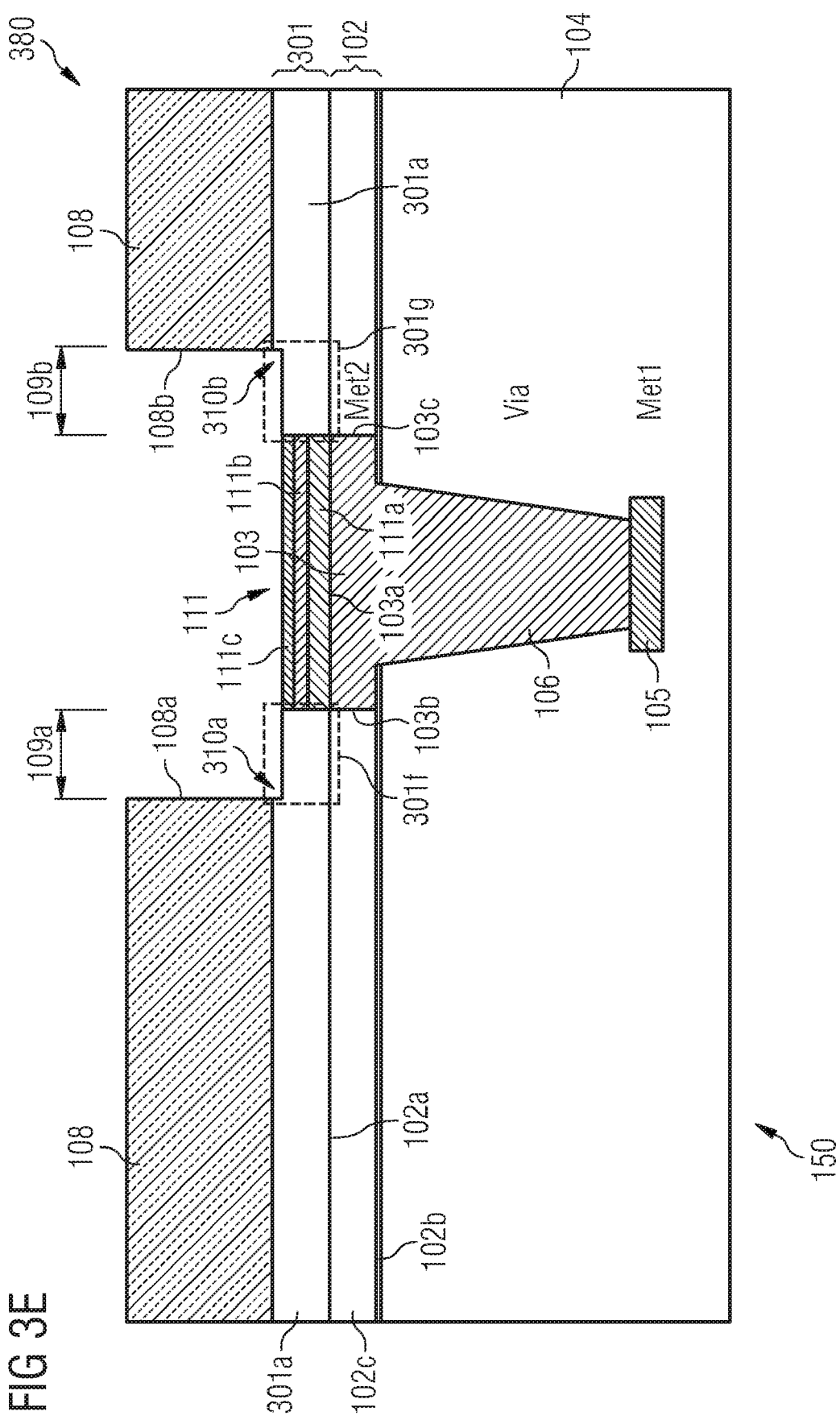

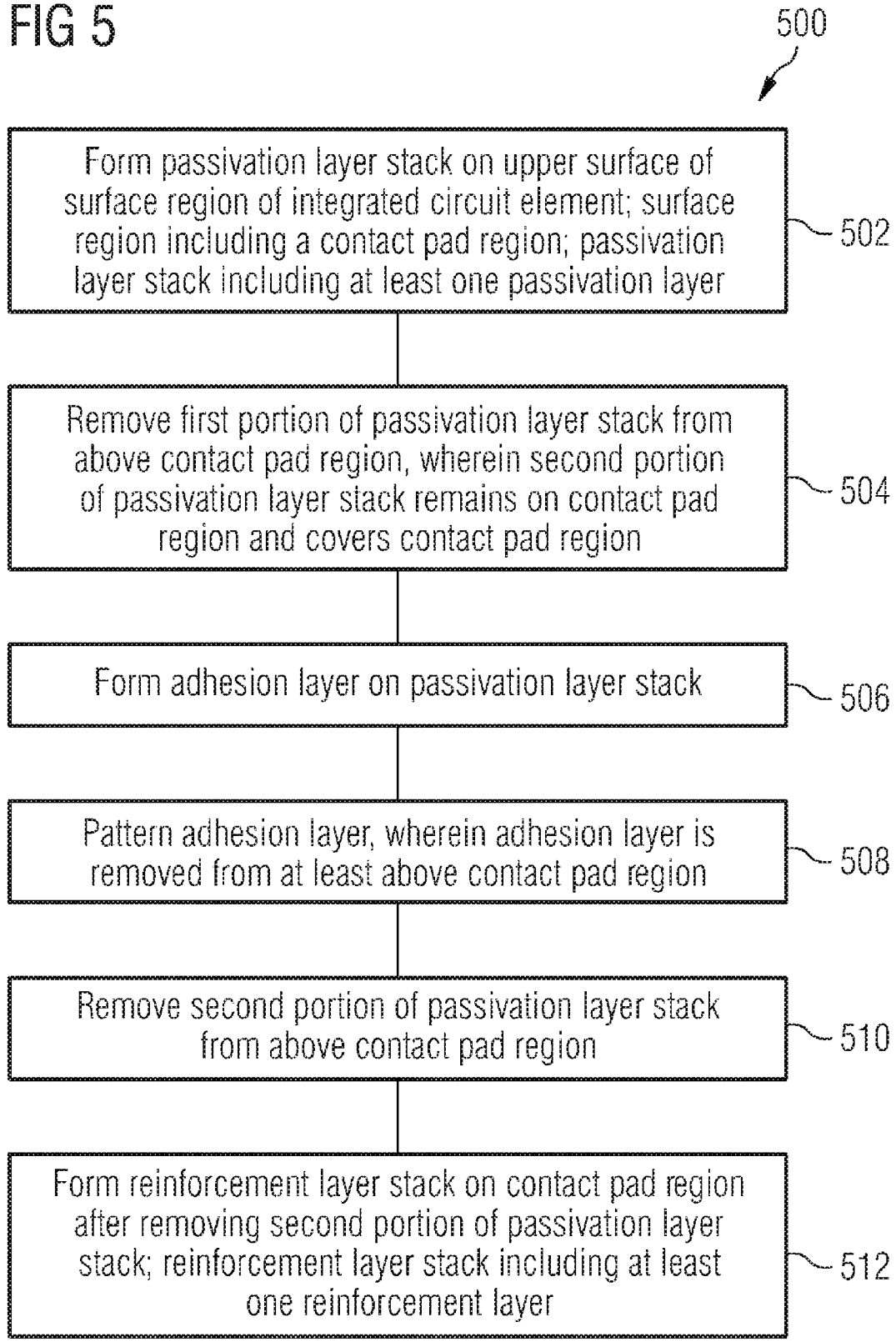

METHOD OF PROCESSING A CONTACT PAD, METHOD OF MANUFACTURING A CONTACT PAD, AND INTEGRATED CIRCUIT ELEMENT

BACKGROUND

Embodiments of the present invention relate generally to the processing of integrated circuit elements and in particular to the processing of contact pads of integrated circuit elements.

Contact pads (also referred to as bond pads or short pads) are commonly used to make external electrical contact with an integrated circuit (IC) element or device, e.g., with a chip.

SUMMARY OF THE INVENTION

A method of processing a contact pad in accordance with an embodiment of the invention includes forming a passivation layer stack on at least an upper surface of a contact pad region, the passivation layer stack including at least one passivation layer; removing a first portion of the passivation layer stack from above the contact pad region, wherein a second portion of the passivation layer stack remains on the contact pad region and covers the contact pad region; forming an adhesion layer on the passivation layer stack; patterning the adhesion layer, wherein the adhesion layer is removed from above the contact pad region; and removing the second portion of the passivation layer stack.

A method of manufacturing a contact pad of an integrated circuit element in accordance with another embodiment of the invention includes forming a passivation layer stack including at least one passivation layer, on an upper surface of a surface region of the integrated circuit element, the surface region including a contact pad region; removing a first portion of the passivation layer stack from above the contact pad region, wherein a second portion of the passivation layer stack remains on the contact pad region and covers the contact pad region; forming an adhesion layer on the passivation layer stack; patterning the adhesion layer, wherein the adhesion layer is removed from at least above the contact pad region; removing the second portion of the passivation layer stack from above the contact pad region; and forming a reinforcement layer stack on the contact pad region after removing the second portion of the passivation layer stack, the reinforcement layer stack including at least one reinforcement layer.

An integrated circuit element in accordance with another embodiment of the invention includes a substrate, a surface region of the substrate including a contact pad region; and a passivation layer stack including at least one passivation layer, formed on the surface region and adjacent to the contact pad region. In a portion of the passivation layer stack proximate the contact pad region, an upper portion of the passivation layer stack is removed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A to FIG. 1E show various processing stages of a method of manufacturing a contact pad of an integrated circuit element in accordance with a first embodiment of the invention;

FIG. 2A to FIG. 2E show various processing stages of a method of manufacturing a contact pad of an integrated circuit element in accordance with a second embodiment of the invention;

FIG. 3A to FIG. 3E show various processing stages of a method of manufacturing a contact pad of an integrated circuit element in accordance with a third embodiment of the invention;

FIG. 5 shows a diagram illustrating a method of manufacturing a contact pad in accordance with an embodiment of the invention.

DETAILED DESCRIPTION OF ILLUSTRATIVE EMBODIMENTS

Figure 1A:
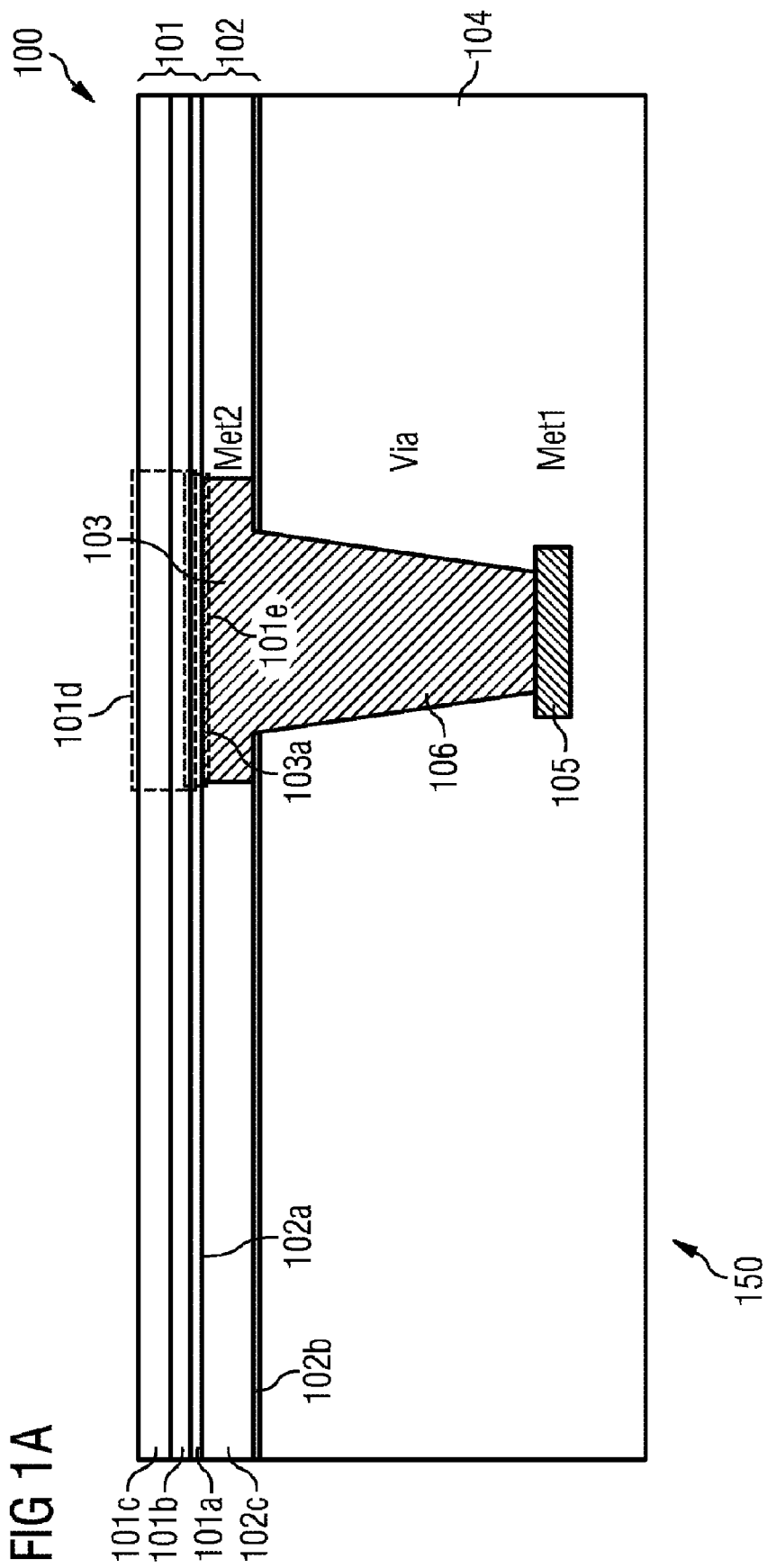

FIG. 1A shows a processing stage 100 of a method of manufacturing a contact pad of an integrated circuit element 150 in accordance with a first embodiment of the invention. The formation of a passivation layer stack 101 is shown on an upper surface of a surface region 102 of the integrated circuit element 150.

The surface region 102 of the integrated circuit element 150 includes a contact pad region 103 ("Met2"), and the passivation layer stack 101 includes a first passivation layer 101a formed on the upper surface of the surface region 102, a second passivation layer 101b formed on the first passivation layer 101a, and a third passivation layer 101c formed on the second passivation layer 101b.

The passivation layer stack 101 further includes a first portion 101d and a second portion 101e. In accordance with the first embodiment, the second portion 101e of the passivation layer stack 101 corresponds to a portion of the first passivation layer 101a that is formed on an upper surface 103a of the contact pad region 103, and the first portion 101d corresponds to a portion of the second passivation layer 101b and the third passivation layer 101c that is formed on the second portion 101e of the passivation layer stack 101.

The integrated circuit element 150 further includes a substrate that includes an electrically insulating layer 104. The electrically insulating layer 104 may be made of or may include an insulating or dielectric material such as, for example, silicon oxide ($SiO_2$). A metallization region 105 ("Met1") is formed within the electrically insulating layer 104 of the substrate, and is electrically connected to the contact pad region 103 by means of a contact hole 106 ("Via") filled with electrically conductive material (e.g., a metal).

The surface region 102 of the integrated circuit element 150 is formed on the electrically insulating layer 104 of the substrate and includes a first insulating layer 102b made of silicon nitride, and further includes a second insulating layer 102c formed on the first insulating layer 102b and made of silicon oxide. In accordance with other embodiments, the first insulating layer 102b and/or the second insulating layer 102c of the surface region 102 may include or may be made of other electrically insulating materials than the ones described above.

In accordance with the embodiment shown in FIG. 1A, the contact pad region 103 is embedded within the second insulating layer 102c of the surface region 102 with the upper surface 103a of the contact pad region 103 being flush with the upper surface 102a of the second insulating layer 102c of the surface region 102.

The metallization region 105 may correspond to a metallization level of the integrated circuit element 150, and the contact pad region 103 may correspond to another metallization level of the integrated circuit element 150. In accordance with one embodiment, the metallization region 105 may correspond to the first metallization level ("Metal 1") of the integrated circuit element 150, and the contact pad region 103 may correspond to the second metallization level ("Metal 2") of the integrated circuit element 150, although in accordance with other embodiments, the metallization region 105 and/or the contact pad region 103 may correspond to other metallization levels of an integrated circuit element, for example to two arbitrary successive metallization levels of an integrated circuit element. In some embodiments, the metallization region 105 may, for example, be configured as an electrically conductive line (e.g., a metal interconnect) that may serve to form an electrical connection of one or more integrated circuits.

In accordance with some embodiments, the substrate may include additional layers formed below the electrically insulating layer 104, for example, other insulating or dielectric layers (e.g., intermetal dielectric layers), other electrically conductive layers such as, for example, electrically conductive lines (e.g., metal interconnects), or other semiconducting layers (not shown in FIG. 1A). For example, in accordance with some embodiments, one or more integrated circuits may be formed in the substrate below the insulating layer 104, and the substrate may include a plurality of metallization levels. In some embodiments, electrically insulating layers (e.g., intermetal dielectrics) may be formed between two successive metallization levels, and different metallization levels may be electrically connected in the vertical direction by means of one or more contact holes (vias).

In one embodiment, the contact pad region 103 is made of copper (Cu). Alternatively, the contact pad region 103 may be made of or may include other materials such as, for example, aluminum (Al) or tungsten (W).

At least one of the passivation layers of the passivation layer stack 101 may be formed by means of a deposition process such as, for example, a chemical vapor deposition (CVD) process, e.g., a plasma enhanced chemical vapor deposition (PECVD) process.

In one embodiment, the first passivation layer 101a is formed by depositing a first silicon nitride ($SiN_x$) layer on the upper surface of the surface region 102 (that is, on the upper surface 102a of the second insulating layer 102c and on the upper surface 103a of the contact pad region 103). The first silicon nitride layer may be formed, for example, by means of a vapor deposition process such as, for example, a CVD process, e.g., PECVD, although other suitable deposition processes may be used in accordance with alternative embodiments.

In accordance with some embodiments, the first passivation layer 101a has a thickness in the range from about 20 nm to about 200 nm, for example, in the range from about 50 nm to about 150 nm, e.g., 100 nm in one embodiment.

In one embodiment, the second passivation layer 101b is formed by depositing a silicon oxide ($SiO_2$) layer on the first passivation layer 101a (for example, the first silicon nitride layer). The silicon oxide layer may be formed, for example, by means of a vapor deposition process such as, for example, a CVD process, e.g., PECVD, although other suitable deposition processes may be used in accordance with alternative embodiments.

In accordance with an alternative embodiment, the second passivation layer 101b may be formed by deposition of a carbide layer, for example, a silicon carbide (SiC) layer.

In accordance with some embodiments, the second passivation layer 101b (for example, the silicon oxide layer) has a thickness in the range from about 100 nm to about 2 μm, for example, in the range from about 500 nm to about 1 μm, e.g., 600 nm in one embodiment.

In one embodiment, the third passivation layer 101c is formed by deposition of a second silicon nitride ($SiN_x$) layer on the second passivation layer 101b (for example, the silicon oxide layer). The third passivation layer 101c may be formed, for example, by means of a vapor deposition process such as, for example, a CVD process, e.g., PECVD, although other suitable deposition processes may be used in accordance with alternative embodiments.

In accordance with some embodiments, the third passivation layer 101c (for example, the second silicon nitride layer) has a thickness in the range from about 100 nm to about 2 μm, for example in the range from about 500 nm to about 1 μm, e.g., 550 nm in one embodiment.

The first passivation layer 101a (e.g., the first silicon nitride layer) of the passivation layer stack 101 may serve as a diffusion barrier in order to prevent or reduce diffusion of material (e.g., Cu material) originating from the contact pad region 103.

In one embodiment, the contact pad region 103 is formed as a planar structured pad 103 (that is, as a pad having a planar surface topography), for example, as a planar copper pad, for example, by means of a single or dual damascene technology.

The integrated circuit element 150 may include other components or elements not shown in FIG. 1A, and the metallization region 105 may, for example, be configured as a conductive line in order to electrically connect other elements of the integrated circuit element 150.

In accordance with some embodiments, the integrated circuit element 150 is configured as a memory element or device, or as a logic element or device, although the integrated circuit element 150 may be configured as a different element in accordance with other embodiments.

FIG. 1B shows another processing stage 120 of the method of manufacturing a contact pad in accordance with the first embodiment of the invention. It is shown that the first portion 101d of the passivation layer stack 101 is removed from above the contact pad region 103, wherein the second portion 101e of the passivation layer stack 101 remains on the contact pad region 103 and covers the contact pad ration 103.

In accordance with the first embodiment, the first portion 101d of the passivation layer stack 101 corresponds to those portions of the second passivation layer 101b and the third passivation layer 101c that are located above the contact pad region 103, and the second portion 101e of the passivation layer stack 101 corresponds to that portion of the first passivation layer 101a that is located on the contact pad region 103 or, more precisely, on the upper surface 103a of the contact pad region 103. Hence, by removing the portions of the second and third passivation layer 101b, 101c that are located above the contact pad region 103, the underlying portion of the first passivation layer 101a is exposed.

In accordance with an embodiment, the first portion 101d of the passivation layer stack 101 may be removed by means of an etch process. For this purpose, in accordance with one embodiment, a photoresist layer (not shown in FIG. 1B), i.e., a layer comprising a photoresist material, may be deposited on the third passivation layer 101c (for example, on the uppermost silicon nitride layer in accordance with an embodiment). Subsequently, the photoresist layer may be patterned such that material of the photoresist layer is removed from above the contact pad region 103.

A photoresist layer, which is patterned in the way described above, clearly may serve as a photoresist mask during the etching of the second and third passivation layer 101b, 101c.

The photoresist layer may, for example, be patterned by means of a conventional lithographical process or by any other suitable process.

In accordance with one embodiment, the second passivation layer 101b and the third passivation layer 101c may be etched away from above the contact pad region 103 by means of a reactive ion etch (RIE) process. In accordance with other embodiments, the second and third passivation layers 101b, 101c may be etched using any other suitable etching process.

Clearly, by means of the etching process, the third passivation layer 101c (for example, the uppermost silicon nitride layer) and the second passivation layer 101b (for example, the silicon oxide layer) are opened above the contact pad region 103 (in other words, above the pad). The first passivation layer 101a (for example, the lowermost silicon nitride layer in accordance with an embodiment) may serve as an etch stop layer during the etching of the second passivation layer 101b and the third passivation layer 101c. In other words, the etching of the second and third passivation layers 101b, 101c may stop on the first passivation layer 101a (for example, on the lowermost silicon nitride layer in accordance with an embodiment) such that the contact pad region 103 (for example, the copper pad) remains completely covered by the first passivation layer 101a. Thus, the contact pad region 103 may be protected against possible subsequent aggressive process steps by means of the first passivation layer 101a (for example, the lowermost silicon nitride layer in accordance with an embodiment), as described herein below.

After etching the second passivation layer 101b and the third passivation layer 101c of the passivation layer stack 101, the remaining material of the photoresist layer may be removed, for example, using an oxygen plasma or wet chemistry (e.g., using a wet chemical etch process) in accordance with an embodiment. Alternatively, the photoresist layer or photoresist mask may be removed by means of in-situ resist ashing in accordance with an embodiment.

Clearly, by means of the etching of the second passivation layer 101b and the third passivation layer 101c, a recess 107 is formed within the passivation layer stack 101 above the contact pad region 103, wherein the bottom surface of the recess 107 is formed by the exposed portion of the first passivation layer 101a (for example, of the lowermost silicon nitride layer in accordance with an embodiment).

The first passivation layer 101a covers the contact pad region 103 (e.g., the copper pad 103) and may thus protect the contact pad region 103 against aggressive or harsh process steps such as, for example, aggressive etching process steps, e.g., against an etching process that may be used to remove the remaining material of the photoresist layer from above the passivation layer stack 101.

In this connection, it is noted that the contact pad region 103 or, more precisely, the upper surface 103a of the contact pad region 103, may have, in principle, an arbitrary shape, for example, a rectangular shape, a quadratic shape, a hexagonal shape, an octagonal shape, a circular shape, etc.

In one embodiment, a lateral dimension or diameter of the contact pad region 103, which corresponds to a diameter of the recess 107 or opening 107, may be approximately 40 μm to 180 μm, although in other embodiments the opening 107 and/or the contact pad region 103 may have other lateral dimensions.

Furthermore, as FIG. 1B only shows a cross-sectional view of the integrated circuit element 150, it is noted that in addition to the contact pad region 103 shown in FIG. 1B, other contact pad regions may be formed within the surface region 102 of the integrated circuit element 150, and clearly be located "in front of" or "behind" the surface plane shown in FIG. 1B. These additional contact pad regions may in each case be connected to the metallization region 105 (e.g., to the conductive line 105) by means of respective contact holes (vias), and may further be processed in a similar manner and/or in parallel to the processing of the contact pad region 103 shown in FIG. 1B.

FIG. 1C shows another processing stage 140 of the method of manufacturing a contact pad in accordance with the first embodiment of the invention. It is shown the formation and patterning of an adhesion layer 108.

The adhesion layer 108 is formed on the passivation layer stack 101, that is, on the remaining portions of the third passivation layer 101c (for example, of the uppermost silicon nitride layer in accordance with an embodiment), and on the exposed portion of the upper surface of the first passivation layer 101a.

In accordance with one embodiment, the adhesion layer 108 is formed by deposition of an imide layer onto the passivation layer stack 101. The imide layer may include an arbitrary imide material, for example an arbitrary photoimide or polyimide material in accordance with an embodiment. In accordance with alternative embodiments, in principle, any material that may be structured or patterned by means of a photolithographical process, or any material that resists a plasma etching process, may be used for the adhesion layer. For example, other suitable resist materials may be used.

The adhesion layer 108 (for example, the photoimide layer) may be deposited on the passivation layer stack 101 using a spin-on process in accordance with one embodiment. In accordance with another embodiment, a vapor deposition process such as, for example, a CVD process may be used to deposit the adhesion layer 108. In accordance with other embodiments, other suitable deposition processes may be used to deposit the adhesion layer 108.

In some embodiments, the adhesion layer 108 is formed such that it has a thickness in the range from about 1 μm to about 50 μm, for example, in the range from about 3 μm to about 20 μm, e.g., 20 μm in one embodiment.

The deposition of the layer 108 (e.g., of the imide layer) further includes depositing the layer 108 onto the exposed portion of the upper surface of the first passivation layer 101a (for example, of the first silicon nitride layer).

The layer 108 is patterned, for example, by means of a photolithographical process in accordance with an embodiment. In the patterning of the adhesion layer 108, the adhesion layer 108 is removed from above the contact pad region 103 or, more precisely, from above the portion of the first passivation layer 101a that covers the contact pad region 103.

In the embodiment shown in FIG. 1C, the patterning of the adhesion layer 108 further includes removing the adhesion layer 108 from above a third portion 101f and a fourth portion 101g of the passivation layer stack 101 located proximate the contact pad region 103, such that lateral spacings 109a, 109b are formed between edges 108a, 108b of the adhesion layer 108 and edges 103b, 103c of the contact pad region 103 as shown in FIG. 1C. In other words, the adhesion layer 108 is patterned in such a way that a first edge 108a of the adhesion layer 108 is pulled back from a first edge 103b of the contact pad region 103, and a second edge 108b of the adhesion layer 108 is pulled back from a second edge 103c of the contact pad region 103.

The lateral spacings 109a, 109b between the adhesion layer 108 (for example, the imide layer) and the contact pad region 103 may have a dimension of approximately about 1 μm to about 10 μm, for example about 3 μm to about 8 μm, e.g., about 5 μm in one embodiment.

Clearly, in accordance with the embodiment shown in FIG. 1C the edges 108a, 108b of the patterned adhesion layer 108 are displaced or shifted by respective spacings 109a, 109b with respect to the inner sidewalls of the recess 107, in other words with respect to the edges 103b, 103c of the contact pad region 103. One effect of pulling back the edges 108a, 108b of the adhesion layer 108 from the contact pad 103 is that a contact or reaction of the material of the adhesion layer 108 (for example, the imide material) with the material of the contact pad region 103 (for example, the copper material of a copper pad) may be avoided.

For example, an imide material that is used for the adhesion layer 108 clearly "works", and by means of shifting the edges 108a, 108b of the adhesion layer 108 away from the contact pad region 103, a contact of the imide material of the adhesion layer 108 with the contact pad region 103 is avoided. In other words, an alignment of the adhesion layer or of the edges 108a, 108b of the adhesion layer 108 with the edge(s) of the contact pad 103 can be avoided. For this reason, also materials which are not compatible with copper (for example, materials which react with copper) may be used as material for the adhesion layer 108. For example, arbitrary imides, and in particular photoimides that are not compatible with copper, may be used as material for the adhesion layer 108.

In the deposition of an imide layer as adhesion layer 108, the deposition of very thin imides is possible as the imide material remains homogeneous during the deposition.

In one embodiment, a post-treatment of the adhesion layer 108 (for example, of the imide layer) is carried out. The post-treatment may include a cyclization of the photoimide material by means of an annealing step and a subsequent oxygen plasma treatment. The tempering or annealing step may include a tempering or heating of the adhesion layer 108 within an inert gas atmosphere such as, for example, a nitrogen ($N_2$) atmosphere, a forming gas atmosphere, or a noble gas (e.g., Ar) atmosphere, for example up to a temperature of approximately about 350° C. to about 450° C., in accordance with embodiments of the invention.

In one embodiment, the cyclizated photoimide material may be post-treated using an oxygen plasma. In this connection, it is noted that the material of the contact pad region 103 (for example, the copper material of a copper contact pad) normally would be oxidized in an oxygen plasma environment. However, in accordance with embodiments of the invention, the upper surface 103a of the contact pad region 103 is covered by the first passivation layer 101a and thus protected against aggressive process steps such as the oxygen plasma post treatment step.

With respect to the patterning of the adhesion layer 108, and in particular with respect to the dimension of the lateral spacings 109a, 109b between the adhesion layer 108 and the contact pad region 103, it is noted that additional contact pad regions (not shown in FIG. 1C) may be formed within the substrate or, more precisely, within the surface region 102 of the integrated circuit element 150 at some distance from the contact pad region 103 shown in FIG. 1C, and the adhesion layer 108 may clearly be formed on portions of the passivation layer stack 101 disposed between two or more contact pad regions, and the lateral spacings 109a, 109b may have such a lateral dimension that clearly the portions of the adhesion layer 108 disposed between two or more contact pad regions have a sufficient width or length and thus a sufficient mechanical or structural stability.

FIG. 1D shows another processing stage 160 of the method of manufacturing a contact pad in accordance with the first embodiment of the invention. It is shown the removal of the second portion 101e of the passivation layer stack 101 from above the contact pad region 103. In accordance with the first embodiment, the removal of the second portion of the passivation layer stack 101 corresponds to the removal of that portion of the first passivation layer 101a that covers the contact pad region 103 from above the upper surface 103a of the contact pad region 103, thereby exposing the upper surface 103a of the contact pad region 103.

In accordance with one embodiment, the first passivation layer 101a is removed from the upper surface 103a of the contact pad region 103 by means of a reactive ion etch (RIE) process. In alternative embodiments, other suitable processes, for example, other suitable etch processes, may be used to remove the first passivation layer 101a from the upper surface 103a of the contact pad region 103. In accordance with one embodiment, the first passivation layer 101a (e.g., the lowermost silicon nitride layer) is etched away from the upper surface 103a of the contact pad region 103 using the second and third passivation layer 101b, 101c (e.g., the silicon oxide layer and the uppermost silicon nitride layer) of the passivation layer stack 101 as a hard mask. In other words, in accordance with an embodiment, the second portion of the passivation layer stack 101 (for example, the lowermost silicon nitride layer) that covers the contact pad region 103 is opened by means of an etching step using the second passivation layer 101b and the third passivation layer 101c (for example, the $SiO_2/SiN_x$ double layer) as a hard mask.

Clearly, by means of the removal of the second portion of the passivation layer stack 101 (that is, by means of removing the portion of the first passivation layer 101a located on the contact pad region 103), the upper surface 103a of the contact pad region 103 is exposed.

In accordance with the first embodiment, in the removal process of the second portion 101e of the passivation layer stack 101 (for example, in the etching of the portion of the first passivation layer 101a covering the contact pad region 103), also an upper portion of the third portion 101f and an upper portion of the fourth portion 101g of the passivation layer stack 101 are removed, such that a first step 110a and a second step 110b are formed within the third passivation layer 101c, as can be seen in FIG. 1D. In other words, during the removal of the first passivation layer 101a from above the upper surface 103a of the contact pad region 103, the third passivation layer 101c is thinned in those regions where it is not covered by the adhesion layer 108.

In this connection it is noted that in accordance with some embodiments the first passivation layer 101a (for example, the first silicon nitride layer) may have a rather small thickness, for example, down to about 20 nm in accordance with an embodiment, such that an etching process, which may be used to remove the first passivation layer 101a from the upper surface 103a of the contact pad region 103, may be applied for a comparatively short time. This has the effect that in the etching of the first passivation layer 101a the exposed portions of the third passivation layer 101c (e.g., of the second silicon nitride layer) and furthermore of the adhesion layer 108 are thinned only very slightly. In other words, since the removal of the first passivation layer 101a from the upper surface 103a of the contact pad region 103 may only take a short time, only very little material is removed from the third passivation layer 101c and/or from the adhesion layer 108.

In some embodiments, one or more cleaning steps such as, for example, a polymer removal step or a copper surface cleaning step, may be carried out after the removal of the second portion of the passivation layer stack 101.

FIG. 1E shows another processing stage 180 of the method of manufacturing a contact pad in accordance with the first embodiment of the invention. It is shown the formation of a reinforcement layer stack 111 on the contact pad region 103. The reinforcement layer stack 111 includes a first reinforcement layer 111a formed on the upper surface 103a of the contact pad region 103, a second reinforcement layer 111b formed on the first reinforcement layer 111a, and a third reinforcement layer 111c formed on the second reinforcement layer 111b.

In some embodiments, at least one of the first, second or third reinforcement layers are formed by means of a deposition process. In accordance with one embodiment, at least one of the first, second or third reinforcement layers are deposited by means of an electroless plating process. By means of electroless plating, the pad reinforcement layer stack 111 may, for example, be deposited selectively onto the contact pad region 103, for example, selectively onto a copper contact pad.

In accordance with an embodiment, the first reinforcement layer 111a includes or is made of nickel (Ni) and/or nickel phosphorous (Ni$_3$P). In accordance with other embodiments, the first reinforcement layer 111a may include or may be made of other materials or material systems such as, for example, a binary material including nickel, a ternary stress-accommodated material, for example, nickel boron (NiB), NiWP, NiMoP, CoWP, or other materials or material systems.

In accordance with some embodiments, the first reinforcement layer 111a has a thickness in the range from about 500 nm to about 10 µm, for example, in the range from about 500 nm to about 3 µm, e.g., 1 µm in one embodiment. The first reinforcement layer 111a may serve to increase the stability of the contact pad.

In accordance with one embodiment, the second reinforcement layer 111b includes or is made of palladium (Pd). In accordance with alternative embodiments, the second reinforcement layer 111b may include or may be made of other materials or material systems such as, for example, platinum (Pt), copper (Cu), silver (Ag). The second reinforcement layer 111b is an optional layer and may have a thickness in the range from about 0 to about 1 µm, for example, in the range from about 50 µm to about 500 nm, e.g., 300 nm in one embodiment.

In accordance with one embodiment, the third reinforcement layer 111c is made of gold (Au). In accordance with alternative embodiments, the third reinforcement layer 111c may include or may be made of other materials or material systems such as, for example, platinum (Pt). The third reinforcement layer 111c is also an optional layer and may have a thickness in the range from about 0 to about 200 nm, for example, in the range from about 20 nm to about 100 nm, e.g., 50 nm in accordance with an embodiment.

In accordance with some embodiments, the thicknesses of the optional second reinforcement layer 111b and of the optional third reinforcement layer 111c may be adapted or optimized for a particular bonding application.

In accordance with the first embodiment shown in FIG. 1E, the total thickness of the reinforcement layer stack 111 (that is, the added thicknesses of the first reinforcement layer 111a, second reinforcement layer 111b and third reinforcement layer 111c) is such that the upper surface of the reinforcement layer stack 111 (or, more precisely, the upper surface of the third reinforcement layer 111c) is flush (in other words, co-planar) with the upper surface of the exposed third portion 101f and fourth portion 101g of the passivation layer stack 101. However, in other embodiments, the upper surface of the reinforcement layer stack 111 may be located lower or higher than the upper surface of the passivation layer stack 101 or, more precisely, than the upper surfaces of the exposed portions 101f, 101g of the passivation layer stack 101.

In accordance with the embodiment shown in FIG. 1E, the third reinforcement layer 111c of the reinforcement layer stack 111 (for example, the gold layer) is not in contact with the adhesion layer 108. Furthermore, the third portion 101f and the fourth portion 101g of the passivation layer stack 101, which are located proximate the contact pad region 103, are free from the adhesion layer 108 (for example, free from the imide layer). In these regions 101f, 101g, the thickness of the third passivation layer 101c is smaller than in those regions of the passivation layer stack 101 that are covered by the adhesion layer 108. Clearly, the third passivation layer 101c has a first step 110a located in the third portion 101f of the passivation layer stack 101, and a second step 110b located in the fourth portion 101g of the passivation layer stack 101, wherein the first and second steps 110a, 110b are a result of the second pad opening step, that is, the removal of the second portion 101e of the passivation layer stack 101 (for example, the etching of the downmost silicon nitride layer) described in connection with FIG. 1D herein above.

Clearly, the method in accordance with the first embodiment of the invention, as described herein above in connection with FIG. 1A to FIG. 1E, includes a two-stage etching of a three-layer passivation layer stack, wherein a contact pad region is protected against aggressive processing steps such as, for example, aggressive etching steps, by means of the lowermost of the three passivation layers of the passivation layer stack, and furthermore includes the formation of a reinforcement layer stack directly onto the contact pad region.

Furthermore, FIG. 1E clearly shows an integrated circuit element 150 in accordance with an embodiment of the invention. The integrated circuit element 150 includes a substrate, a surface region 102 of the substrate including a contact pad region 103. Furthermore, the integrated circuit element 150 includes a passivation layer stack 101 formed on the surface region 102 and adjacent to the contact pad region 103. The passivation layer stack 101 includes a first passivation layer 101a formed on the surface region 102, a second passivation layer 101b formed on the first passivation layer 101a, and a third passivation layer 111c formed on the second passivation layer 101b. In a portion 101f and a portion 101g of the passivation layer stack 101 proximate the contact pad region 103, an upper portion of the passivation layer stack 101 is removed. The integrated circuit element 150 further includes an adhesion layer 108 formed on the passivation layer stack 101. In the portions 101f and 101g of the passivation layer stack 101, the passivation layer stack 101 is free from the adhesion layer 108. The integrated circuit element 150 further includes a reinforcement layer stack 111 formed on an upper surface 103a of the contact pad region 103. The reinforcement layer stack 111 includes a first reinforcement layer 111a formed on the upper surface 103a of the contact pad region 103, a second reinforcement layer 111b formed on the first reinforcement layer 111a, and a third reinforcement layer 111c formed on the second reinforcement layer 111b. The upper surface of the reinforcement layer stack 111 is flush with the upper surface of the passivation layer stack 101 or, more precisely, with the upper surface of the third passivation layer 101c within the portions 111f, 111g of the passivation layer stack 101.

In the following, various processing stages of a method of manufacturing a contact pad of an integrated circuit element in accordance with a second embodiment of the present invention are described with respect to FIG. 2A to FIG. 2E. The individual processing stages are to some extent similar to those of the method of manufacturing a contact pad in accordance with the first embodiment of the invention, described herein above in connection with FIG. 1A to FIG. 1E, the main difference of the method according to the second embodiment being that a passivation layer stack is formed which includes only two passivation layers, as described herein below.

For the interest of brevity, elements and/or steps that are similar or identical to those described in connection with method according to the first embodiment, will not be re-described in detail. Instead, reference is made to the description given above in connection with FIG. 1A to FIG. 1E.

FIG. 2A shows a processing stage 200 of the method of manufacturing a contact pad in accordance with the second embodiment of the invention. Similarly to FIG. 1A, it is shown the formation of a passivation layer stack 201 on an upper surface of a surface region 102 of an integrated circuit element 150, the surface region 102 including a contact pad region 103. In accordance with the second embodiment, the passivation layer stack 201 includes a first passivation layer 201a formed on the upper surface 102a of the surface region 102, and a second passivation layer 201b formed on the first passivation layer 201a.

The passivation layer stack 201 further includes a first portion 201d and a second portion 201e. In accordance with the second embodiment, the second portion 201e of the passivation layer stack 201 corresponds to a portion of the first passivation layer 201a that is formed on the upper surface 103a of the contact pad region 103, and the first portion 201d corresponds to a portion of the second passivation layer 201b that is formed on the second portion 201e of the passivation layer stack 201.

In accordance with an embodiment, at least one of the first passivation layer 201a and the second passivation layer 201b may be formed by a deposition process, for example, a CVD process such as, for example, PECVD. However, in alternative embodiments, the formation of the first passivation layer 201a and/or of the second passivation layer 201b may be achieved by other suitable deposition methods.

In one embodiment, the first passivation layer 201a is formed as a silicon nitride ($SiN_x$) layer, and the second passivation layer 201b is formed as a silicon oxide ($SiO_2$) layer. However, in alternative embodiments the first passivation layer 201a and/or the second passivation layer 201b may include or may be made of other materials. For example, in one embodiment, the second passivation layer 201b may be formed as a silicon carbide (SiC) layer.

In some embodiments, the thicknesses of the first passivation layer 201a and the second passivation layer 201b are chosen such that the thickness of the second passivation layer 201b is considerably greater than the thickness of the first passivation layer 201a. In accordance with an embodiment, the first passivation layer 201a (for example, the silicon nitride layer) and/or the second passivation layer 201b (for example, the silicon oxide layer) may have similar thicknesses as described for the first and second passivation layer of the passivation layer stack 101 of the first embodiment.

FIG. 2B shows another processing stage 220 of the method of manufacturing a contact pad in accordance with the second embodiment of the invention. Similarly to FIG. 1B, it is shown the removal of the first portion 201d of the passivation layer stack 201 from above the contact pad region 103, wherein the second portion 201e of the passivation layer stack 201 remains on the contact pad region 103 and covers the contact pad region 103. In accordance with the second embodiment, the removal of the first portion 201d of the passivation layer stack 201 corresponds to the removal of the second passivation layer 201b (for example, the silicon oxide layer) from above the contact pad region 103 such that the portion of the first passivation layer 201a (for example, the silicon nitride layer) that is located on the contact pad region 103, is exposed.

Clearly, by removing the first portion 201d of the passivation layer stack 201, a recess 207 is formed above the contact pad region 103, with the bottom surface of the recess 207 being formed by the exposed portion of the first passivation layer 201a. The removal of the first portion 201d of the passivation layer stack 201, that is the removal of the second passivation layer 201b from above the contact pad region 103, may be achieved by means of an etching process similar to the etching of the second and/or third passivation layer of the passivation layer stack 101 described herein above in connection with FIG. 1B.

In the method in accordance with the second embodiment, the first passivation layer 201a (for example, the silicon nitride layer) may serve as an etch stop layer when etching the second passivation layer 201b (for example, the silicon oxide layer). Similarly to the first embodiment described in connection with FIG. 1B, the first passivation layer 201a remains on the contact pad region 103 and covers the contact pad region 103 so that the contact pad region 103 may be protected against subsequent aggressive processing steps as described herein above in connection with the first embodiment.

Figure 2C:
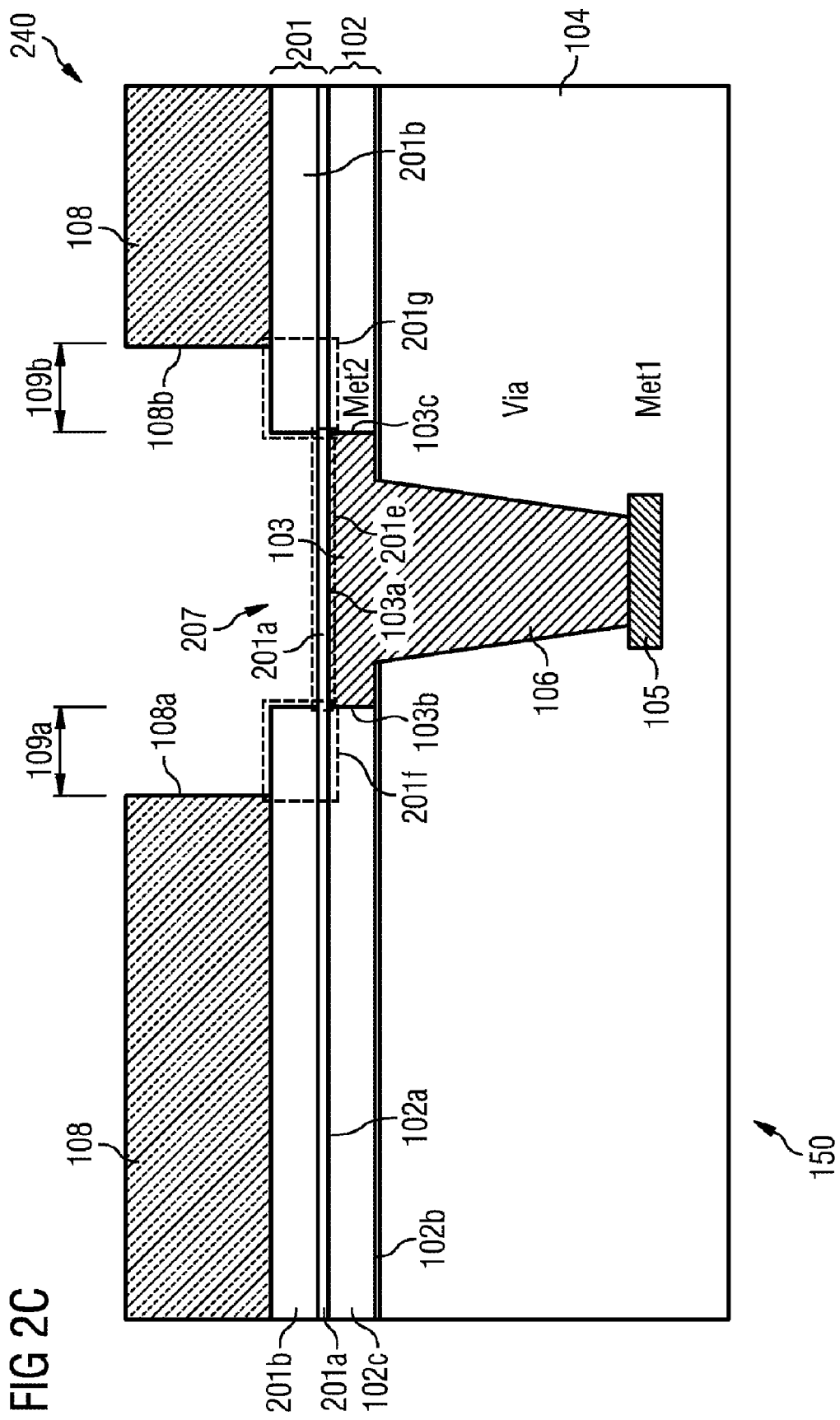

FIG. 2C shows another processing stage 240 of the method of manufacturing a contact pad in accordance with the second embodiment of the invention. Similarly to FIG. 1C, it is shown the formation of an adhesion layer 108 on the passivation layer stack 201, and the patterning of the adhesion layer 108, wherein the adhesion layer 108 is removed from at least above the contact pad region 103. The formation and the patterning of the adhesion layer 108 may be achieved in a similar manner as described herein above in connection with FIG. 1C.

In accordance with the second embodiment, the adhesion layer 108 is pulled back from the edges 103b, 103c of the contact pad region 103 such that a first spacing 109a is formed between the first edge 108a of the adhesion layer 108 and the first edge 103b of the contact pad region 103, and a second spacing 109b is formed between the second edge 108b of the adhesion layer 108 and the second edge 103c of the contact pad region 103. Thus, a third portion 201f and a fourth portion 201g of the passivation layer stack 201 are free from the adhesion layer 108. In other words, an upper surface of the second passivation layer 201b is exposed within the portions 201f and 201g of the passivation layer stack 201.

In accordance with the second embodiment, the contact pad region 103 is protected against possible aggressive processing steps, e.g., aggressive etching steps, which may, for example, occur during the formation and/or patterning of the adhesion layer 108, by means of the first passivation layer 201a covering the contact pad region 103.

Figure 2D:
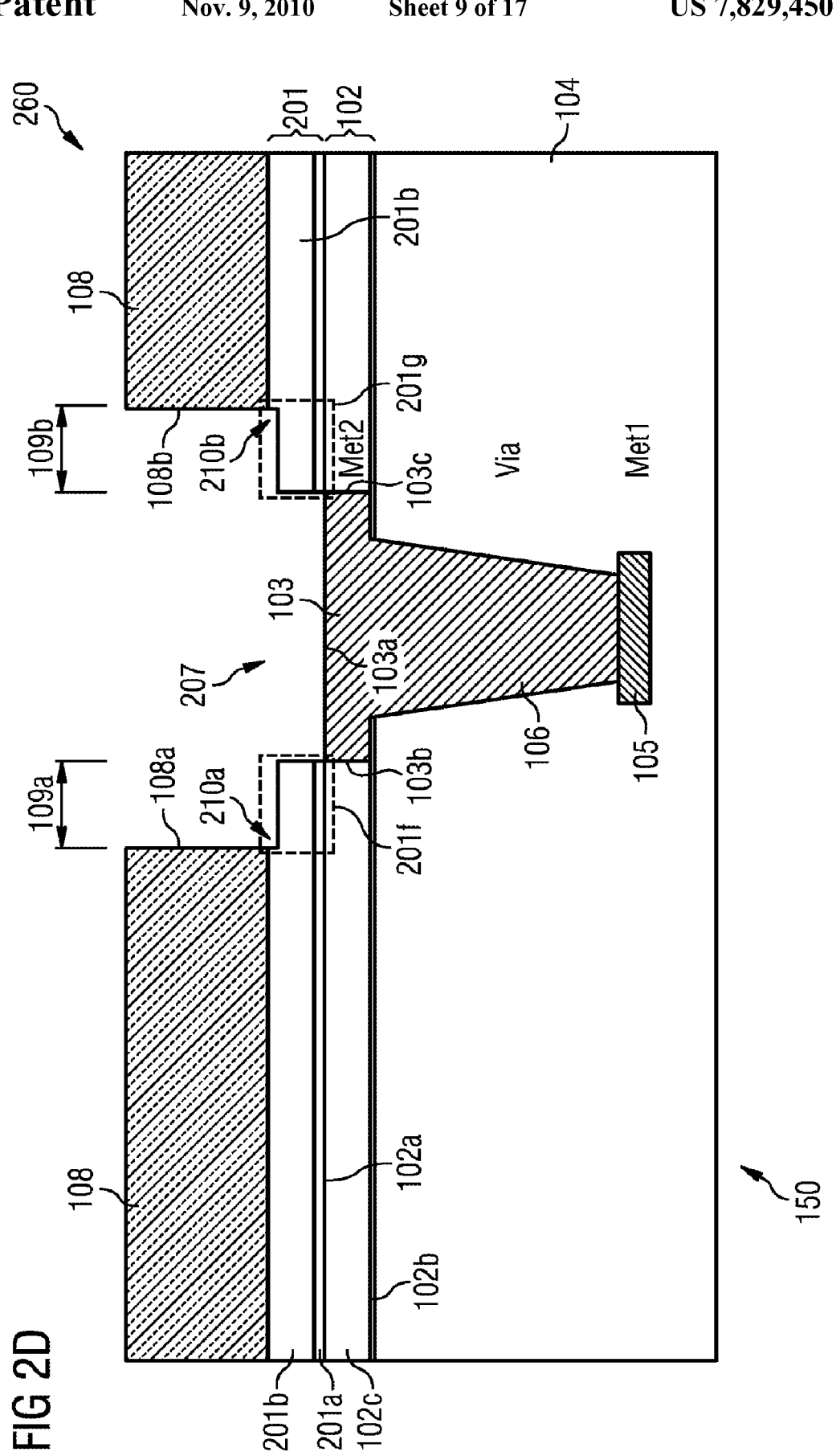

FIG. 2D shows another processing stage 260 of the method of manufacturing a contact pad in accordance with the second embodiment of the invention. Similarly to FIG. 1D, it is shown the removal of the second portion 201e of the passivation layer stack 201 from above the contact pad region 103. In accordance with the second embodiment, the removal of the second portion 201e of the passivation layer stack 201 corresponds to the removal of the first passivation layer 201a from above the contact pad region 103, such that the upper surface 103a of the contact pad region 103 is exposed. In other words, the first passivation layer 201a is opened above the contact pad region 103 such that the bottom surface of the recess 207 is now formed by the upper surface 103a of the contact pad region 103.

In one embodiment, the removal of the second portion 201e of the passivation layer stack 201 (that is, the removal of the first passivation layer 201a from above the contact pad region 103) is achieved by means of an etching process, for example, as an etching process as described herein above in connection with FIG. 1B.

Similarly as described herein above in connection with FIG. 1B, an upper portion of the second passivation layer 201b is removed during the removal of the first passivation layer 201a within the portions 201f and 201g of the passivation layer stack 201 proximate the contact pad region 103, that is within the portions 201f, 201g of the passivation layer stack 201 that are not covered by the adhesion layer 108. Thus, a first step 210a is formed in the second passivation layer 201b within the third portion 201f of the passivation layer stack 201, and a second step 210b is formed in the passivation layer 201b within the fourth portion 201g of the passivation layer stack 201, as shown in FIG. 2D and similarly to the first embodiment described in connection with FIG. 1D.

Figure 2E:
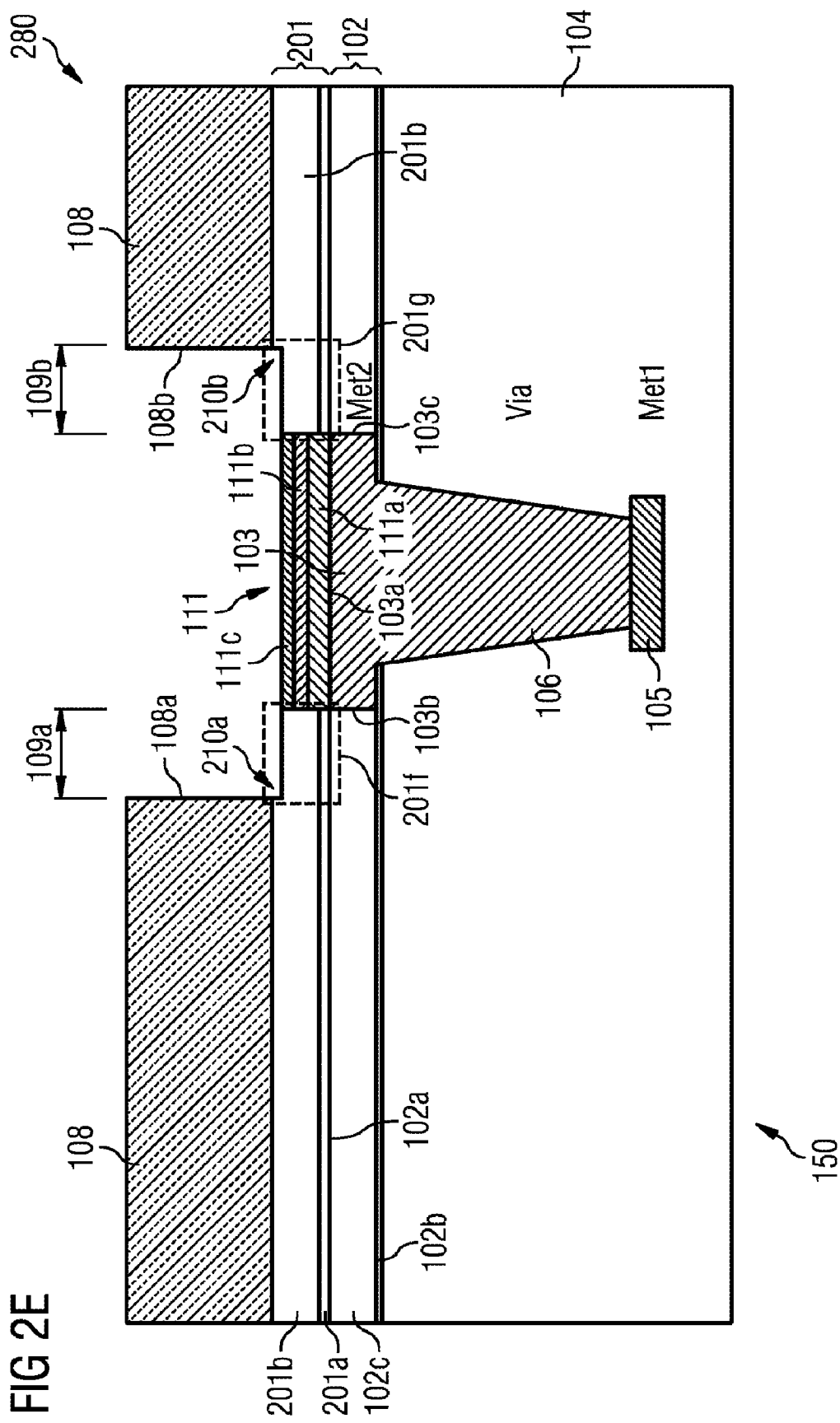

FIG. 2E shows another processing stage 280 of the method of manufacturing a contact pad in accordance with the second embodiment of the invention. Similarly to FIG. 1E, it is shown the formation of a reinforcement layer stack 111 on the contact pad region 103 after the removal of the second portion 201e of the passivation layer stack 201. The reinforcement layer stack 111 includes a first reinforcement layer 111a, a second reinforcement layer 111b and a third reinforcement layer 111c, which may be configured and/or formed in a similar manner as described herein above for the first embodiment in connection with FIG. 1E.

Although it is shown that the reinforcement layer stack 111 includes three reinforcement layers 111a, 111b, and 111c, it is to be understood that the reinforcement layer stack 111 may alternatively include a different number of reinforcement layers as described herein above in connection with FIG. 1E.

Furthermore, it is shown in FIG. 2E that the upper surface of the reinforcement layer stack 111 (that is, the upper surface of the third reinforcement layer 111c) is flush with the upper surface of the passivation layer stack 201 or, more precisely, with the upper surfaces of the third and fourth portion 201f, 201g of the passivation layer stack 201. However, as described herein above, the upper surface of the reinforcement layer stack 111 may also be located lower or higher than the upper surface of the passivation layer stack 201. The number of reinforcement layers and/or the material of the individual reinforcement layers of the reinforcement layer stack 111 may be adapted to a particular bonding application as mentioned above in connection with the first embodiment.

Clearly, the method in accordance with the second embodiment of the invention, as described herein above in connection with FIG. 2A to FIG. 2E, includes a two-stage etching of a two-layer passivation layer stack, wherein a contact pad region is protected against aggressive processing steps such as, for example, aggressive etching steps, by means of the lower one of the two passivation layers of the passivation layer stack, and furthermore includes the formation of a reinforcement layer stack directly onto the contact pad region.

Furthermore, FIG. 2E clearly shows an integrated circuit element 150 in accordance with an embodiment of the invention. The integrated circuit element 150 includes a substrate, a surface region 102 of the substrate including a contact pad region 103. Furthermore, the integrated circuit element 150 includes a passivation layer stack 201 formed on the surface region 102 and adjacent to the contact pad region 103. The passivation layer stack 201 includes a first passivation layer 201a formed on the surface region 102, and a second passivation layer 201b formed on the first passivation layer 201a. In a portion 201f and a portion 201g of the passivation layer stack 201 proximate the contact pad region 103, an upper portion of the passivation layer stack 201 is removed. The integrated circuit element 150 further includes an adhesion layer 108 formed on the passivation layer stack 201. In the portions 201f and 201g of the passivation layer stack 201, the passivation layer stack 201 is free from the adhesion layer 108. The integrated circuit 150 further includes a reinforcement layer stack 111 formed on an upper surface 103a of the contact pad region 103. The reinforcement layer stack 111 includes a first reinforcement layer 111a formed on the upper surface 103a of the contact pad region 103, a second reinforcement layer 111b formed on the first reinforcement layer 111a, and a third reinforcement layer 111c formed on the second reinforcement layer 111b. The upper surface of the reinforcement layer stack 111 is flush with the upper surface of the passivation layer stack 201 or, more precisely, with the upper surface of the second passivation layer 201b within the portions 201f, 201g of the passivation layer stack 201.

In the following, various processing stages of a method of manufacturing a contact pad of an integrated circuit element in accordance with a third embodiment of the invention are described with respect to FIG. 3A to FIG. 3E. The individual processing stages are to some extent similar to those of the methods of manufacturing a contact pad in accordance with the first or second embodiment of the invention, described herein above in connection with FIG. 1A to FIG. 2E, the main difference of the method according to the third embodiment being that a passivation layer stack is formed which includes only one passivation layer, as described herein below.

For the interest of brevity, elements and/or steps that are similar or identical to those described in connection with the method according to the first or second embodiment will not be re-described in detail. Reference is made to the description given above in connection with FIG. 1A to FIG. 2E.

FIG. 3A shows a processing stage 300 of the method of manufacturing a contact pad in accordance with the third embodiment of the invention. Similarly to FIG. 1A and FIG. 2A, it is shown the formation of a passivation layer stack 301 on an upper surface of a surface region 102 of an integrated circuit element 150, the surface region 102 including a contact pad region 103. The passivation layer stack 301 includes a passivation layer 301a formed on the upper surface of the surface region 102.

The passivation layer stack 301 further includes a first portion 301d and a second portion 301e. In accordance with the third embodiment, the second portion 301e of the passivation layer stack 301 corresponds to a portion of the passivation layer 301a that is formed on an upper surface 103a of the contact pad region 103, and the first portion 301d corresponds to a portion of the passivation layer 301a that is formed on the second portion 301e of the passivation layer stack 301.

The passivation layer 301a is formed on the upper surface 103a of the contact pad region 103 and on the upper surface of an insulating layer 102c formed within the surface region 102.

In one embodiment, the passivation layer 301a is formed as a silicon nitride ($SiN_x$) layer. However, in accordance with other embodiments, the passivation layer 301a may include or may be made of other materials.

In some embodiments, the passivation layer 301a (for example, the silicon nitride layer) is formed by means of a vapor deposition process such as, for example, a CVD process, e.g., PECVD. However, in accordance with other embodiments, the passivation layer 301a may be formed by other suitable techniques.

The passivation layer 301a may have a thickness in the range from about 30 nm to about 4 µm, for example, in the range from about 40 nm to about 2 µm, e.g., 1 µm in one embodiment.

FIG. 3B shows another processing stage 320 of the method of manufacturing a contact pad in accordance with the third embodiment of the invention. Similarly to FIG. 1B and FIG. 2B, it is shown the removal of the first portion 301d of the passivation layer stack 301 from above the contact pad region 103, wherein the second portion 301e of the passivation layer stack 301 remains on the contact pad region 103 and covers the contact pad region 103.

In accordance with the third embodiment, the removal of the first portion 301d of the passivation layer stack 301 corresponds to removing an upper portion of the passivation layer 301a (for example, of the silicon nitride layer) from above the contact pad region 103, wherein a (thin) lower portion of the passivation layer 301a (for example, of the silicon nitride layer) remains on the contact pad region 103 and covers the contact pad region 103. Thus, after removing the first portion 301d of the passivation layer stack 301, the passivation layer 301a has a small thickness in a region above the contact pad region 103 (for example, in some embodiments, a thickness which is approximately the same as the thickness of the first passivation layer 101a shown in FIG. 1A), and has a greater thickness in those regions of the passivation layer stack 301 that are not located above the contact pad region 103 (or above any other additional contact pad region not shown in FIG. 3B).

In one embodiment, the removal of the first portion 301d of the passivation layer stack 301 is achieved by means of an etching process in a similar manner as described herein above in connection with the first or second embodiment. In this connection, it is noted that, in accordance with one embodiment, the etching process that may be used to remove the first portion 301d of the passivation layer stack 301 may be configured as an etch process with a predetermined fixed time duration. Clearly, the etching time of the etch process may be chosen in such a way that a thin portion (i.e., the second portion 301e) of the passivation layer 301a remains on the contact pad region 103 after the etching of the first portion 301d of the passivation layer stack 301 is completed. In other words, in accordance with the third embodiment, the etch stop of the etching process may be defined by a predetermined etching time, whereas in accordance with the first and the second embodiment the etch stop may, for example, be achieved by means of the lowermost passivation layer of the passivation layer stack serving as an etch stop layer.

Clearly, by removing the first portion 301d of the passivation layer stack 301, a recess 307 is formed above the contact pad region 103, with the bottom surface of the recess 307 being formed by the upper surface of the second portion 301e of the passivation layer stack 301.

FIG. 3C shows another processing stage 340 of the method of manufacturing a contact pad in accordance with the third embodiment of the invention. Similarly to FIG. 1C and FIG. 2C it is shown the formation of an adhesion layer 108 on the passivation layer stack 301, and the patterning of the adhesion layer 108, wherein the adhesion layer 108 is removed from at least above the contact pad region 103. The formation and/or patterning of the adhesion layer 108 may be achieved in a similar manner as described herein above in connection with the methods according to the first or second embodiment.

In accordance with the third embodiment and similar to the first and second embodiment, the adhesion layer 108 is patterned in such a way, that a third portion 301f and a fourth portion 301g of the passivation layer stack 301 proximate the contact pad region 103 are free from the adhesion layer 108. In other words, the edges 108a, 108b of the patterned adhesion layer 108 are pulled back such that spacings 109a, 109b are formed between the edges 108a, 108b of the adhesion layer 108 and the edges 103a, 103b of the contact pad region 103 as shown in FIG. 3C and described herein above in connection with the methods according to the first embodiment and the second embodiment.

Figure 3D:
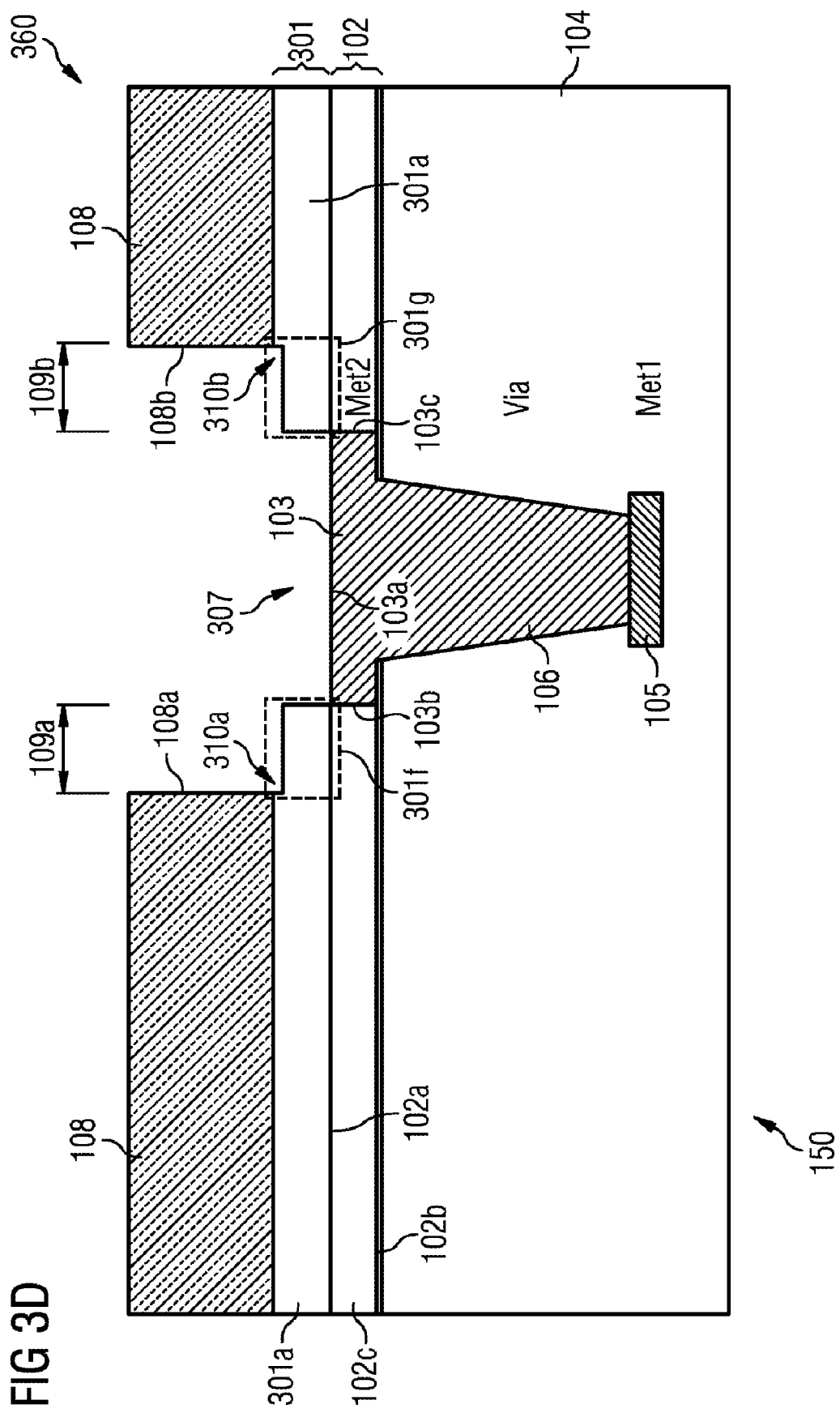

FIG. 3D shows another processing stage 360 of the method of manufacturing a contact pad in accordance with the third embodiment of the invention. Similarly to FIG. 1D and FIG. 2D, it is shown the removal of the second portion 301e of the passivation layer stack 301 from above the contact pad region 103. In accordance with the third embodiment, the removal of the second portion 301e of the passivation layer stack 301 corresponds to the removal of the thin portion of the passivation layer 301a (for example, of the silicon nitride layer) located above the contact pad region 103.

By removing the second portion 301e of the passivation layer stack 301 from above the contact pad region 103, the upper surface 103a of the contact pad region 103 is exposed.

In one embodiment, the removal of the second portion 301e of the passivation layer stack 301 is achieved by means of an etching process as described herein above in connection with the first embodiment and the second embodiment. In this connection, it is noted that during the etching of the second portion 301e of the passivation layer stack 301 also an upper portion of the third portion 301f and an upper portion of the fourth portion 301g of the passivation layer stack 301 located proximate the contact pad region 103 are removed, thereby forming steps 310a, 310b within the passivation layer 301a in the portions 301f, 301g of the passivation layer stack 301 as can be seen in FIG. 3D and as is also described herein above in connection with the first embodiment and the second embodiment.

FIG. 3E shows another processing stage 380 of the method of manufacturing a contact pad in accordance with the third embodiment of the invention. Similarly to FIG. 1E and FIG. 2E it is shown the formation of a reinforcement layer stack 111 on the contact pad region 103 after removal of the second portion 301e of the passivation layer stack 301 (that is, after the removal of the thin portion of the passivation layer 301a located on the contact pad region 103).

The reinforcement layer stack includes three reinforcement layers 111a, 111b and 111c, and may be formed in a similar manner as described herein above in connection with the first and second embodiment. In accordance with the third embodiment, the upper surface of the reinforcement layer stack 111 is flush with the upper surface of the passivation layer stack 301 or, more precisely, with the upper surface of the portions 301f and 301g of the passivation layer stack 301 located proximate the contact pad region 103.

In accordance with other embodiments, the reinforcement layer stack 111 may include a different number of reinforcement layers and/or the upper surface of the reinforcement layer stack 111 may be located lower or higher than the upper surface of the passivation layer stack 301. In principle, as described before in connection with the first and second embodiments of the invention, the number of reinforcement layers in the reinforcement layer stack 111 and/or the materials of the individual reinforcement layers may be chosen or adapted with respect to a particular bonding application.

Clearly, the method of manufacturing a contact pad in accordance with the third embodiment, as described herein above in connection with FIG. 3A to FIG. 3E, includes a two-stage etching of a passivation layer, wherein in a first etching stage an upper portion of the passivation layer is removed leaving a thin lower portion on the contact pad region and covering the contact pad region. Thus, the contact pad region may be protected against aggressive processing steps (such as, for example, aggressive etching steps) involved, for example, in the formation and/or patterning of an adhesion layer formed on the passivation layer stack. In a second stage, the thin portion of the passivation layer is removed such that the contact pad region is exposed. Furthermore, in accordance with the third embodiment, a reinforcement layer stack is formed directly on the contact pad region.

Furthermore, FIG. 3E clearly shows an integrated circuit element 150 in accordance with an embodiment of the invention. The integrated circuit element 150 includes a substrate, a surface region 102 of the substrate including a contact pad region 103. Furthermore, the integrated circuit element 150 includes a passivation layer stack 301 formed on the surface region 102 and adjacent to the contact pad region 103. The passivation layer stack 301 includes a passivation layer 301a formed on the surface region 102. In a portion 301f and a portion 301g of the passivation layer stack 301 proximate the contact pad region 103, an upper portion of the passivation layer stack 301 is removed. The integrated circuit element 150 further includes an adhesion layer 108 formed on the passivation layer stack 301. In the portions 301f and 301g of the passivation layer stack 301, the passivation layer stack 301 is free from the adhesion layer 108. The integrated circuit 150 further includes a reinforcement layer stack 111 formed on an upper surface 103a of the contact pad region 103. The reinforcement layer stack 111 includes a first reinforcement layer 111a formed on the upper surface 103a of the contact pad region 103, a second reinforcement layer 111b formed on the first reinforcement layer 11a, and a third reinforcement layer 111c formed on the second reinforcement layer 111b. The upper surface of the reinforcement layer stack 111 is flush with the upper surface of the passivation layer stack 301 or, more precisely, with the upper surface of the passivation layer 301a within the portions 301f, 301g of the passivation layer stack 301.

Figure 4:
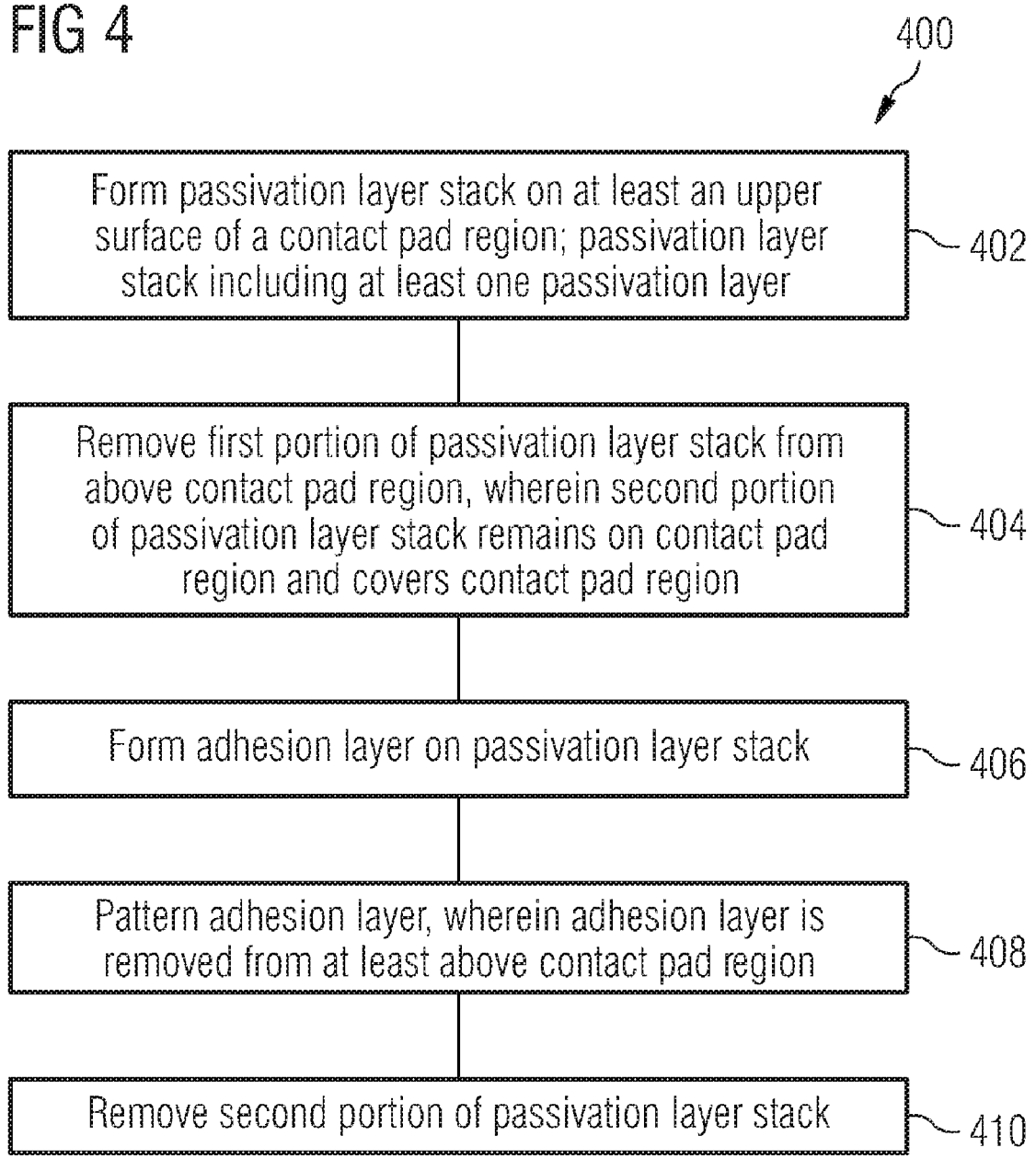
FIG. 4 shows a diagram illustrating a method of processing a contact pad in accordance with an embodiment of the invention.

FIG. 4 shows a diagram 400 that illustrates a method of processing a contact pad in accordance with an embodiment of the invention.

In 402, a passivation layer stack is formed on at least an upper surface of a contact pad region, the passivation layer stack including at least one passivation layer. The passivation layer stack may be formed in accordance with embodiments described herein above.

In 404, a first portion of the passivation layer stack is removed from above the contact pad region, wherein a second portion of the passivation layer stack remains on the contact pad region and covers the contact pad region. The first portion of the passivation layer stack may be removed in accordance with one of the embodiments described herein above.

In 406, an adhesion layer is formed on the passivation layer stack. The adhesion layer may be formed in accordance with one of the embodiments described herein above.

In 408, the adhesion layer is patterned, wherein the adhesion layer is removed from above the contact pad region. The patterning of the adhesion layer and the removal of the adhesion layer from above the contact pad region may be achieved in accordance with one of the embodiments described herein above.

In 410, the second portion of the passivation layer stack is removed. The removal of the second portion of the passivation layer stack may be achieved in accordance with one of the embodiments described herein above.

In accordance with one embodiment, a reinforcement layer stack is formed on the contact pad region after removing the second portion of the passivation layer stack, the reinforcement layer stack including at least one reinforcement layer. In accordance with another embodiment, forming the passivation layer stack includes depositing a first passivation layer on at least the upper surface of the contact pad region, depositing a second passivation layer on the first passivation layer, and depositing a third passivation layer on the second passivation layer. In accordance with another embodiment, removing the first portion of the passivation layer stack includes removing the third and the second passivation layer from above the contact pad region. In accordance with another embodiment, removing the third and the second passivation layer from above the contact pad region includes an etch process. In accordance with another embodiment, the etch process includes depositing a photoresist layer on the third passivation layer, patterning the photoresist layer such that material of the photoresist layer is removed from above the contact pad region, etching the third and second passivation layer, wherein the first passivation layer is used as an etch stop, and removing the remaining material of the photoresist layer. In accordance with another embodiment, the remaining material of the photoresist layer is removed using an oxygen plasma or a wet chemical etch. In accordance with another embodiment, removing the second portion of the passivation layer stack includes removing the first passivation layer from the upper surface of the contact pad region. In accordance with another embodiment, removing the first passivation layer from the upper surface of the contact pad region includes an etch process. In accordance with another embodiment, depositing the third passivation layer includes depositing a layer that has a greater thickness than the first passivation layer or that is harder to etch than the first passivation layer. In accordance with another embodiment, depositing the first passivation layer includes depositing a first nitride layer, depositing the second passivation layer includes depositing an oxide layer or a carbide layer, and depositing the third passivation layer includes depositing a second nitride layer. In accordance with another embodiment, the first nitride layer has a thickness in the range from about 20 nm to about 200 nm, the oxide layer or the carbide layer has a thickness in the range from about 100 nm to about 2 μm, and the second nitride layer has a thickness in the range from about 100 nm to about 2 μm. In accordance with another embodiment, the deposition of at least one of the first, second and third passivation layer includes a chemical vapor deposition process. In accordance with another embodiment, forming the adhesion layer includes depositing an imide layer. In accordance with another embodiment, patterning the adhesion layer includes removing the adhesion layer from above the contact pad region and further from above a third portion of the passivation layer stack adjacent to the contact pad region, such that a lateral spacing is formed between the adhesion layer and the contact pad region. In accordance with another embodiment, the lateral spacing has a width in the range from about 1 μm to about 10 μm. In accordance with another embodiment, the contact pad region includes copper, aluminum or tungsten. In accordance with another embodiment, forming the reinforcement layer stack includes depositing a first reinforcement layer on the upper surface of the contact pad region, depositing a second reinforcement layer on the first reinforcement layer, and depositing a third reinforcement layer on the second reinforcement layer. In accordance with another embodiment, the first reinforcement layer includes one or more of the following materials: nickel, a binary material including nickel, a ternary stress-accommodated material. In accordance with another embodiment, the first reinforcement layer includes one or more of the following materials: nickel phosphorus (NiP), nickel boron (NiB), NiWP, NiMoP, CoWP. In accordance with another embodiment, the second reinforcement layer includes one or more of the following materials: palladium (Pd), platinum (Pt), copper (Cu), silver (Ag). In accordance with another embodiment, the third reinforcement layer includes one or more of the following materials: gold (Au), platinum (Pt). In accordance with another embodiment, the deposition of at least one of the first, second and third reinforcement layer includes an electroless plating process. In accordance with another embodiment, the first reinforcement layer has a thickness in the range from about 500 nm to about 10 µm, the second reinforcement layer has a thickness in the range from about 0 to about 1 µm, and the third reinforcement layer has a thickness in the range from about 0 to about 200 nm.

FIG. 5 shows a diagram 500 that illustrates a method of manufacturing a contact pad of an integrated circuit element in accordance with an embodiment of the invention.

In 502, a passivation layer stack is formed on an upper surface of a surface region of the integrated circuit element, the surface region including a contact pad region, and the passivation layer stack including at least one passivation layer. The passivation layer stack may be formed in accordance with one of the embodiments described herein.

In 504, a first portion of the passivation layer stack is removed from above the contact pad region, wherein a second portion of the passivation layer stack remains on the contact pad region and covers the contact pad region. The first portion of the passivation layer stack may be removed in accordance with one of the embodiments described herein.

In 506, an adhesion layer is formed on the passivation layer stack. The adhesion layer may be formed in accordance with one of the embodiments described herein.

In 508, the adhesion layer is patterned, wherein the adhesion layer is removed from at least above the contact pad region. The patterning of the adhesion layer and the removal of the adhesion layer from above the contact pad region may be achieved in accordance with one of the embodiments described herein.

In 510, the second portion of the passivation layer stack is removed from above the contact pad region. The removal of the second portion of the passivation layer stack may be achieved in accordance with one of the embodiments described herein.

In 512, a reinforcement layer stack is formed on the contact pad region after removing the second portion of the passivation layer stack, the reinforcement layer stack including at least one reinforcement layer.

In accordance with one embodiment, forming the passivation layer stack includes depositing a first nitride layer on the upper surface of the surface region, depositing an oxide layer on the first nitride layer, and depositing a second nitride layer on the oxide layer. In accordance with another embodiment, removing the first portion of the passivation layer stack includes etching the second nitride layer and the oxide layer from above the contact pad region using the first nitride layer as an etch stop. In accordance with another embodiment, forming the reinforcement layer stack includes depositing a first reinforcement layer on an upper surface of the contact pad region, depositing a second reinforcement layer on the first reinforcement layer, and depositing a third reinforcement layer on the second reinforcement layer. In accordance with another embodiment, the deposition of at least one of the first, second and third reinforcement layer includes an electroless plating process.

In the following, additional features and effects of exemplary embodiments of the invention are discussed.

In accordance with an embodiment of the invention, a high-temperature resistant contact pad or bonding pad is provided on a metallization region such as, for example, a copper metallization (alternatively, other metallizations such as, for example, an aluminum or a tungsten metallization). In one embodiment, the pad surface is coated with palladium and/or gold. For example, a thin layer of gold is formed on a thin layer of palladium.

In another embodiment of the invention, an intermediate layer of, e.g., nickel is formed on the metallization, for example, on the copper metallization (alternatively, on the aluminum or tungsten metallization). This intermediate layer may increase the strength of the pad during a bonding of the pad.

In accordance with another embodiment of the invention, a polyimide layer is formed on a passivation structure or stack. This polyimide layer may be used as an adhesion layer for providing adherence to a package body. In accordance with an embodiment of the invention, the polyimide layer is formed in such a manner that a mechanical contact of the polyimide layer with the copper metallization is avoided. Thus, in addition to polyimide materials that are compatible with copper, also polyimide materials may be used that are not compatible with the copper material of the copper metallization.

In accordance with another embodiment of the invention, a method of manufacturing a contact pad of an integrated circuit element is provided, wherein a planar chip surface or a planar topography is achieved so that improved high voltage characteristics of the pad may be achieved and/or the development of cracks in the pad may be prevented. Thus, high-quality contact pads may be obtained that have favorable high-voltage characteristics and are free from cracks.

In accordance with one embodiment of the invention, a passivation layer stack is deposited onto a planar structured copper pad. The copper pad may have been patterned, for example, by a single or dual damascene technology. In one embodiment, the passivation layer stack includes a first silicon nitride ($SiN_x$) layer having a thickness in the range from about 20 nm to about 200 nm, a silicon oxide ($SiO_2$) layer formed on the first silicon nitride layer and having a thickness in the range from about 100 nm to about 2 µm, and a terminating second silicon nitride ($SiN_x$) layer formed on the silicon oxide layer and having a thickness in the range from about 100 nm to about 2 µm. The first silicon nitride layer may serve as a copper diffusion barrier layer, in other words, as a layer that reduces or prevents diffusion of copper material or atoms (from the pad) into the passivation layer stack.

In accordance with an embodiment of the invention, the topmost silicon nitride layer (i.e., the second silicon nitride layer) and the silicon oxide layer of the passivation layer stack are opened above the pad, for example, using a photoresist mask and an etch process. In one embodiment, the etching of the passivation layer stack terminates on the lower silicon nitride layer (i.e., the first silicon nitride layer) of the passivation layer stack. In other words, the lower silicon nitride layer of the passivation layer stack may serve as an etch stop layer during the etching of the passivation layer stack. Thus, the contact pad (e.g., the copper pad) remains fully covered by the first silicon nitride layer so that the contact pad or the contact pad surface (e.g., the copper surface) is protected against subsequent aggressive process steps.

In one embodiment, after etching away the second silicon nitride layer and the silicon oxide layer of the passivation layer stack, the photoresist is removed, for example, by means of an oxygen plasma or a wet chemical process. The contact pad surface is protected against these aggressive process steps by the remaining first silicon nitride layer.

In one embodiment, after removing the photoresist, a photoimide or polyimide layer is applied to or deposited onto the passivation layer stack (i.e., on the upper surface of the passivation layer stack), and the photoimide layer is patterned. In one embodiment, the patterning is carried out in such a way that the polyimide edge (i.e., the edge of the polyimide layer) is pulled back from the contact pad edge, for example, by several microns (e.g., 5 μm) in one embodiment. Thus, a distance or spacing is formed between the photoimide layer and the contact pad. This has, for example, the effect that also photoimide materials may be used that are not compatible with copper, in other words, photoimide materials that react with copper.

In one embodiment, after applying the photoimide layer, a cyclization of the photoimide layer is carried out by means of an annealing step, and subsequently the photoimide layer is post-treated using an oxygen plasma. The contact pad surface is also protected against these aggressive process steps by means of the remaining first silicon nitride layer that covers the contact pad.

In accordance with one embodiment, the remaining first silicon nitride layer is opened or removed by means of a subsequent etch step using the $SiO_2/SiN_x$ double layer (that is, the silicon oxide layer and the second silicon nitride layer of the passivation layer stack) as a hard mask. In one embodiment, after opening the first silicon nitride layer, subsequent cleaning steps (e.g., removal of polymer material, cleaning of copper surface of the contact pad) are carried out.

In accordance with another embodiment, a pad reinforcement layer stack is then deposited by means of an electrochemical deposition process. In one embodiment, the pad reinforcement layer stack includes a layer sequence including a Ni and/or $Ni_3P$ layer having a thickness in the range from about 500 nm to about 10 μm, a Pd layer formed on the $Ni/Ni_3P$ layer and having a thickness in the range from about 0 nm to about 1 μm, and an Au layer formed on the Pd layer and having a thickness in the range from about 0 nm to about 200 nm. In accordance with an embodiment, the total thickness of the reinforcement layer stack may be chosen such that the pad surface (that is, the upper surface of the pad having the reinforcement layer stack formed thereon) is flush with the upper surface of the passivation layer stack.

In accordance with some embodiments of the invention, the formation of an additional aluminum pad on a copper pad can be saved in a reinforcement process of a copper pad.

In accordance with some embodiments of the invention, polyimide materials that are incompatible with copper may be used in a method of processing and/or reinforcing a copper contact pad.

In accordance with some embodiments of the invention, a planar topography or a planar chip surface may be achieved in a method of manufacturing a contact pad of an integrated circuit element.

In accordance with some embodiments of the invention, a two-stage etching process is applied to etch a three-layer passivation layer stack, and a copper pad formed below the passivation layer stack is reinforced directly. In accordance with some embodiments, the copper surface of the pad may be protected against aggressive process steps (such as, for example, aggressive etching steps) and the pad reinforcement layers may be sunk in the passivation.

In accordance with some embodiments of the invention, methods of processing or manufacturing a contact pad (or a plurality of contact pads) of an integrated circuit element are provided. In accordance with one embodiment, the contact pad(s) or the integrated circuit element may be part of an integrated electronic device, such as, for example, an integrated memory device or an integrated logic device.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing a contact pad, the method comprising:
    forming a passivation layer stack over at least an upper surface of a contact pad region, the passivation layer stack comprising at least one passivation layer;
    removing a first portion of the passivation layer stack from above the contact pad region, wherein a second portion of the passivation layer stack remains on the contact pad region and covers the contact pad region;
    forming an adhesion layer on the passivation layer stack;
    patterning the adhesion layer, wherein the adhesion layer is removed from above the contact pad region; and
    removing the second portion of the passivation layer stack.

2. The method of claim 1, further comprising:
    forming a reinforcement layer stack over the contact pad region after removing the second portion of the passivation layer stack, the reinforcement layer stack comprising at least one reinforcement layer.

3. The method of claim 2, wherein forming the reinforcement layer stack comprises:
    depositing a first reinforcement layer on the upper surface of the contact pad region;
    depositing a second reinforcement layer on the first reinforcement layer; and
    depositing a third reinforcement layer on the second reinforcement layer.

4. The method of claim 3, wherein depositing of at least one of the first, second and/or third reinforcement layers comprises an electroless plating process.

5. The method of claim 1, wherein forming the passivation layer stack comprises:
    depositing a first passivation layer on at least the upper surface of the contact pad region;
    depositing a second passivation layer on the first passivation layer; and
    depositing a third passivation layer on the second passivation layer.

6. The method of claim 5, wherein removing the first portion of the passivation layer stack comprises removing the third and the second passivation layer from above the contact pad region.

7. The method of claim 6, wherein removing the third and the second passivation layer from above the contact pad region comprises an etch process.

8. The method of claim 7, wherein the etch process comprises:
    depositing a photoresist layer over the third passivation layer;

patterning the photoresist layer such that material of the photoresist layer is removed from above the contact pad region;

etching the third and second passivation layer, wherein the first passivation layer is used as an etch stop; and removing remaining material of the photoresist layer.

9. The method of claim 6, wherein removing the second portion of the passivation layer stack comprises removing the first passivation layer from the upper surface of the contact pad region.

10. The method of claim 5, wherein depositing the third passivation layer comprises depositing a layer that has a greater thickness than the first passivation layer or that is harder to etch than the first passivation layer.

11. The method of claim 5, wherein depositing the first passivation layer comprises depositing a first nitride layer, wherein depositing the second passivation layer comprises depositing an oxide layer or a carbide layer, and wherein depositing the third passivation layer comprises depositing a second nitride layer.

12. The method of claim 1, wherein patterning the adhesion layer comprises removing the adhesion layer from above the contact pad region and further from above a third portion of the passivation layer stack adjacent to the contact pad region, such that a lateral spacing is formed between the adhesion layer and the contact pad region.

13. The method of claim 1, wherein the contact pad region comprises copper, aluminum or tungsten.

14. A method of manufacturing an integrated circuit, the method comprising:

forming a passivation layer stack comprising at least one passivation layer, over an upper surface of a surface region of the integrated circuit element, the surface region comprising a contact pad region;

removing a first portion of the passivation layer stack from above the contact pad region, wherein a second portion of the passivation layer stack remains on the contact pad region and covers the contact pad region;

forming an adhesion layer on the passivation layer stack;

patterning the adhesion layer, wherein the adhesion layer is removed from at least above the contact pad region;

removing the second portion of the passivation layer stack from above the contact pad region; and forming a reinforcement layer stack on the contact pad region after removing the second portion of the passivation layer stack, the reinforcement layer stack comprising at least one reinforcement layer.

15. The method of claim 14, wherein forming the passivation layer stack comprises:

depositing a first nitride layer on the upper surface of the surface region;

depositing an oxide layer on the first nitride layer; and depositing a second nitride layer on the oxide layer.

16. The method of claim 15, wherein removing the first portion of the passivation layer stack comprises etching the second nitride layer and the oxide layer from above the contact pad region using the first nitride layer as an etch stop.

* * * * *